United States Patent
Nakanishi

(10) Patent No.: US 10,528,287 B2
(45) Date of Patent: Jan. 7, 2020

(54) MEMORY, MEMORY CONTROLLER, STORAGE APPARATUS, INFORMATION PROCESSING SYSTEM, AND CONTROL METHOD FOR TRACKING ERASE COUNT AND REWRITE CYCLES OF MEMORY PAGES

(71) Applicant: SONY CORPORATION, Tokyo (JP)

(72) Inventor: Kenichi Nakanishi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/761,590

(22) PCT Filed: Jul. 1, 2016

(86) PCT No.: PCT/JP2016/069604
§ 371 (c)(1),
(2) Date: Mar. 20, 2018

(87) PCT Pub. No.: WO2017/061153
PCT Pub. Date: Apr. 13, 2017

(65) Prior Publication Data
US 2018/0349059 A1 Dec. 6, 2018

(30) Foreign Application Priority Data
Oct. 9, 2015 (JP) ................. 2015-201271

(51) Int. Cl.
*G06F 3/06* (2006.01)
*G06F 12/16* (2006.01)
*G11C 13/00* (2006.01)
*G11C 16/08* (2006.01)
(Continued)

(52) U.S. Cl.
CPC .......... *G06F 3/0659* (2013.01); *G06F 3/0604* (2013.01); *G06F 3/0634* (2013.01);
(Continued)

(58) Field of Classification Search
CPC .... G06F 3/0604; G06F 3/0634; G06F 3/0632; G06F 3/0679; G06F 12/16
USPC ........................................................ 711/103
See application file for complete search history.

(56) References Cited

U.S. PATENT DOCUMENTS 5,898,868 A * 4/1999 Krueger .............. G06F 11/1435
714/2
2004/0114444 A1 6/2004 Matsuoka
(Continued)

FOREIGN PATENT DOCUMENTS

| CN | 1505052 A | 6/2004 |
|---|---|---|
| JP | 2004-234707 A | 8/2004 |

(Continued)

OTHER PUBLICATIONS

International Search Report and Written Opinion of PCT Application No. PCT/JP2016/069604, dated Aug. 2, 2016, 09 pages.

*Primary Examiner* — Than Nguyen
(74) *Attorney, Agent, or Firm* — Chip Law Group

(57) ABSTRACT

To enhance accuracy of counting the number of rewrite cycles in a non-volatile memory that is overwritable. A memory outputs erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state. The number of rewrite cycles is counted by updating the number of rewrite cycles on a basis of the output erase information.

11 Claims, 25 Drawing Sheets

(51) Int. Cl.
  *G11C 16/10*  (2006.01)
  *G11C 16/14*  (2006.01)
  *G11C 16/34*  (2006.01)
  *G11C 11/16*  (2006.01)
  *G11C 7/10*   (2006.01)

(52) U.S. Cl.
  CPC .......... *G06F 3/0652* (2013.01); *G06F 3/0679* (2013.01); *G06F 12/16* (2013.01); *G11C 11/1653* (2013.01); *G11C 11/1675* (2013.01); *G11C 13/0023* (2013.01); *G11C 13/0035* (2013.01); *G11C 13/0069* (2013.01); *G11C 13/0097* (2013.01); *G11C 16/08* (2013.01); *G11C 16/10* (2013.01); *G11C 16/14* (2013.01); *G11C 16/349* (2013.01); *G11C 7/1009* (2013.01); *G11C 2013/0076* (2013.01)

(56) References Cited

U.S. PATENT DOCUMENTS

| | | |
|---|---|---|
| 2006/0203546 A1 | 9/2006 | Lasser |
| 2011/0289389 A1* | 11/2011 | Laurent .................. G11C 16/06 714/773 |
| 2013/0054878 A1* | 2/2013 | Lee ..................... G06F 12/0246 711/103 |
| 2013/0254498 A1 | 9/2013 | Adachi et al. |
| 2014/0006692 A1* | 1/2014 | Berntsen ............. G06F 12/0246 711/103 |
| 2015/0149710 A1* | 5/2015 | Oh ..................... H01L 27/11524 711/103 |
| 2016/0098220 A1* | 4/2016 | Rousseau ............ G06F 12/0246 711/103 |
| 2016/0103625 A1* | 4/2016 | Fujimoto ................. G06F 13/16 711/103 |
| 2016/0188221 A1* | 6/2016 | Janik ..................... G06F 3/0611 711/103 |
| 2017/0053704 A1* | 2/2017 | Nagashima ......... G06F 11/1048 |

FOREIGN PATENT DOCUMENTS

| | | |
|---|---|---|
| JP | 5272013 B2 | 8/2013 |
| JP | 2013-225368 A | 10/2013 |
| KR | 10-2004-0048864 A | 6/2004 |
| WO | 2010/038736 A1 | 4/2010 |

* cited by examiner

| Page address | Number of rewrite cycles |
|---|---|
| #1 | 10 |
| #2 | 15 |
| ⋮ | ⋮ |
| #n | 3 |

FIG.7

| Page address | Program information |
|---|---|
| #1 | 0 |
| #2 | 1 |
| ⋮ | ⋮ |
| #n | 0 |

| Request | Data | Number of bits of erase processing | Number of bits of program processing | Program information (before execution) | Number of rewrite cycles | Program information (after execution) |
|---|---|---|---|---|---|---|
| — | 0b11111111 | — | — | — | — | 1 |
| Write 1 | 0b00000000 | 8 | 0 | 1 | +1 | 0 |
| Write 2 | 0b11111111 | 0 | 8 | 0 | — | 1 |
| Write 3 | 0b00111111 | 2 | 0 | 1 | +1 | 0 |
| Write 4 | 0b00001111 | 2 | 0 | 0 | — | 0 |
| Write 5 | 0b00000011 | 2 | 0 | 0 | — | 0 |
| Write 6 | 0b11000000 | 2 | 2 | 0 | — | 1 |
| Write 7 | 0b11000000 | 0 | 0 | 1 | — | 1 |
| Write 8 | 0b00000000 | 2 | 0 | 1 | +1 | 0 |
| Write 9 | 0b00000000 | 0 | 0 | 0 | — | 0 |
| Write 10 | 0b00001111 | 0 | 4 | 0 | — | 1 |
| Write 11 | 0b11110000 | 4 | 4 | 1 | +1 | 1 |
| Write 12 | 0b11111111 | 0 | 4 | 1 | — | 1 |

FIG.14

| Erase processing | Program processing | Program information (before execution) | Number of rewrite cycles | Program information (after execution) |
|---|---|---|---|---|
| 0 | 0 | 0 | — | 0 |
| 0 | 0 | 1 | — | 1 |
| 0 | 1 | 0 | — | 1 |
| 0 | 1 | 1 | — | 1 |
| 1 | 0 | 0 | — | 0 |
| 1 | 0 | 1 | +1 | 0 |
| 1 | 1 | 0 | — | 1 |
| 1 | 1 | 1 | +1 | 1 |

FIG.15

| Page address | Number of rewrite cycles | |
| --- | --- | --- |
| | Region 1 | Region 2 |
| #1 | 10 | 8 |
| #2 | 15 | 17 |
| ⋮ | ⋮ | ⋮ |
| #n | 3 | 9 |

| Page address | Program information ||
|---|---|---|
| | Region 1 | Region 2 |
| #1 | 0 | 0 |
| #2 | 1 | 0 |
| ⋮ | ⋮ | ⋮ |
| #n | 0 | 0 |

FIG.20

| Request | Data | Number of bits of erase processing | Number of bits of program processing | Program information (before execution) | Number of rewrite cycles | Program information (after execution) |
|---|---|---|---|---|---|---|
| — | 0b01111010 | — | — | — | — | 1/1 |
| Write 1 | 0b00011010 | 2/0 | 0/0 | 1/1 | +1/— | 0/1 |
| Write 2 | 0b00011110 | 0/0 | 0/1 | 0/1 | —/— | 0/1 |
| Write 3 | 0b00001111 | 1/0 | 0/1 | 0/1 | —/— | 0/1 |
| Write 4 | 0b10000101 | 0/2 | 1/0 | 0/1 | —/+1 | 1/0 | a

| Request | Data | Number of bits of erase processing | Number of bits of program processing | Program information (before execution) | Number of rewrite cycles | Program information (after execution) |
|---|---|---|---|---|---|---|
| — | 0b01111010 | — | — | — | — | 1 |
| Write 1 | 0b00011010 | 2 | 0 | 1 | +1 | 0 |
| Write 2 | 0b00011110 | 0 | 1 | 1 | — | 1 |
| Write 3 | 0b00001111 | 1 | 1 | 1 | +1 | 1 |
| Write 4 | 0b10000101 | 2 | 1 | 1 | +1 | 1 | b

MEMORY, MEMORY CONTROLLER, STORAGE APPARATUS, INFORMATION PROCESSING SYSTEM, AND CONTROL METHOD FOR TRACKING ERASE COUNT AND REWRITE CYCLES OF MEMORY PAGES

CROSS REFERENCE TO RELATED APPLICATIONS

This application is a U.S. National Phase of International Patent Application No. PCT/JP2016/069604 filed on Jul. 1, 2016, which claims priority benefit of Japanese Patent Application No. JP 2015-201271 filed in the Japan Patent Office on Oct. 9, 2015. Each of the above-referenced applications is hereby incorporated herein by reference in its entirety.

TECHNICAL FIELD

The present technology relates to a memory, a memory controller, a storage apparatus, an information processing system, and a control method for a memory. More particularly, the present technology relates to a non-volatile memory, a memory controller, a storage apparatus, and an information processing system that write data in the non-volatile memory, and a control method therein.

BACKGROUND ART

Conventionally, it is known that a non-volatile memory such as a flash memory for the use in a storage apparatus has a limitation on the number of rewrite cycles. Here, the number of rewrite cycles can be counted by adding a cycle in which a memory cell in an initial state is put into a state in which data is stored and returned to the initial state again, as one rewrite cycle. In such a non-volatile memory, data is rewritten by erasing and writing in units of pages. Therefore, the number of rewrite cycles is added up for each page. There has been proposed a storage apparatus having reliability enhanced by achieving wear leveling to swap data of a page in which this number of rewrite cycles is larger for data of a page in which the number of rewrite cycles is smaller (e.g., see Patent Literature 1).

CITATION LIST

Patent Literature

Patent Literature 1: U.S. Unexamined Patent Application Publication No. 2006/0203546

DISCLOSURE OF INVENTION

Technical Problem

The conventional technology above is intended for a non-volatile memory that is not overwritable, such as a flash memory. Writing of data in this flash memory is performed as follows. First of all, a memory controller outputs a write request to request the flash memory to write the data. Next, the flash memory performs bulk erase processing of setting values of all memory cells in a write-target page to the value "1" that is an initial state on a basis of the write request. Next, the flash memory selects a desired memory cell of the write-target page, causes it to store the value "0", and terminates the writing of data. Alternatively, the writing of data is performed in such a manner that the memory controller outputs a bulk erase request to the flash memory and then outputs a write request. In this manner, the flash memory constantly returns to the initial state due to the bulk erase processing at the time of writing. Therefore, the memory controller is capable of counting the number of rewrite cycles by adding up the number of write requests or the number of bulk erase requests.

In contrast, in the non-volatile memory that is overwritable, a method of writing the value "0" or the value "1" in a desired memory cell is used, and the bulk erase processing is not performed unlike the flash memory. Examples of this non-volatile memory that is overwritable can include an EEPROM (Electrically Erasable and Programmable Read Only Memory) and an ReRAM (Resistive RAM). Further, a PCRAM (Phase-Change RAM) and an MRAM (Magnetoresistive RAM) also correspond to this non-volatile memory that is overwritable. In these non-volatile memories, all memory cells in a page are not put into the initial state even when writing is performed, and memory cells in the page, in which rewriting is unnecessary, are not set as write-targets. Therefore, there is a problem that the number of rewrite cycles of the non-volatile memory cannot be accurately counted even when the memory controller adds up the number of write requests.

The present technology has been conceived in view of the above-mentioned circumstances and it is an object thereof to enhance accuracy of counting the number of rewrite cycles in a non-volatile memory that is overwritable.

Solution to Problem

The present technology has been made for overcoming the above-mentioned problem, and a first aspect thereof is a memory and a control method for the memory. The memory outputs erase information that is information regarding whether or not erase processing has been performed on a memory cell in a page in writing of data in units of pages each including a plurality of memory cells in which data is rewritten by program processing of shifting the memory cell that stores data from an initial state to a data-storing state and erase processing of shifting the memory cell from the data-storing state to the initial state. With this, the erase information is output from the memory to a memory controller. Thus, there is provided an action that the memory controller is capable of knowing whether or not the erase processing has been performed on the memory cell in the page.

Further, in this first aspect, the memory may further output program information that is information regarding whether or not the program processing has been performed on the memory cell in the page in the writing. With this, the erase information and the program information are output from the memory to the memory controller. Therefore, there is provided an action that the memory controller is capable of knowing whether or not the erase processing and the program processing have been performed on the memory cell in the page.

Further, in this first aspect, the memory may output the erase information for each of regions obtained by dividing the page into predetermined sizes. With this, the erase information of each region is output from the memory to the memory controller. Thus, there is provided an action that the memory controller is capable of knowing whether or not the erase processing has been performed for each of the regions obtained by dividing the page.

Further, a second aspect of the present technology is a memory controller including: a counting-of-number-of-rewrite-cycles determination unit that determines, on a basis of erase information from a memory that outputs the erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state, whether or not to count the erase processing as the number of rewrite cycles of each of the pages; and a number-of-rewrite-cycles management unit that updates and retains the number of rewrite cycles for each of the pages on a basis of a result of the determination. With this, there is provided an action that, on a basis of the erase information output from the memory to the memory controller, the number of times the erase processing has been performed is added up for each page. That is, there is provided an action that the memory controller knows that the erase processing has been performed in the memory and counts the number of rewrite cycles.

Further, in this second aspect, the memory may further output program information that is information regarding whether or not the program processing has been performed in the writing. The memory controller may further include a program information retention unit that retains the output program information for each of the pages. It may be determined that the erase processing is to be counted as the number of rewrite cycles in a case where the program information retained in previous writing when the writing is continuously performed on an identical page of the pages indicates execution of the program processing and the erase information indicates execution of the erase processing in the continuous writing. On the other hand, in a case where the program processing has not been executed in any of the continuous writing and only the erase processing has been executed, it indicates that the erase processing of different memory cells in the page has been executed in that continuous writing. In this case, it is determined that the erase processing is not to be counted as the number of rewrite cycles in writing after the second time. With this, there is provided an action that, on a basis of the erase information output in a case where the program information retained by the memory controller indicates execution of the program processing, the number of times the erase processing has been performed is added up for each page. That is, there is provided an action that the number of rewrite cycles is counted in a case where the program processing and the erase processing have been sequentially executed in the continuous writing in the identical page.

Further, in this second aspect, the memory may output the erase information for each of regions obtained by dividing the page into predetermined sizes. The counting-of-number-of-rewrite-cycles determination unit may perform the determination for each of the regions. The number-of-rewrite-cycles management unit may update and retain the number of rewrite cycles for each of the regions on a basis of a result of the determination. The memory controller may further include a number-of-rewrite-cycles output unit that outputs a maximum number of rewrite cycles among the numbers of rewrite cycles of the respective regions in the retained page, as the number of rewrite cycles in the page. With this, there is provided an action that a maximum number of rewrite cycles among the number of rewrite cycles counted for each region is employed as the number of rewrite cycles of the page including that region.

Further, in this second aspect, the memory controller may further include a data-swapping control unit that controls data swapping of writing data read from one page of the pages in another page, the one page and the other page including a page having a larger number of rewrite cycles and a page having a smaller number of rewrite cycles, the larger number of rewrite cycles and the smaller number of rewrite cycles being included in the number of rewrite cycles retained in the number-of-rewrite-cycles management unit. With this, there is provided an action that data swapping is performed between the page having a larger number of rewrite cycles and the page having a smaller number of rewrite cycles. By moving the data of the page having a larger number of rewrite cycles to the page having a smaller number of rewrite cycles, the number of rewrite cycles in that page will be increased. Further, by moving the data of the page having a smaller number of rewrite cycles to the page having a larger number of rewrite cycles, the increase in number of rewrite cycles in that page will be suppressed.

Further, a third aspect of the present technology is a storage apparatus including: a memory that outputs erase information that is information regarding whether or not erase processing has been performed on a memory cell in a page in writing of data in units of pages each including a plurality of memory cells in which data is rewritten by program processing of shifting the memory cell that stores data from an initial state to a data-storing state and erase processing of shifting the memory cell from the data-storing state to the initial state; a counting-of-number-of-rewrite-cycles determination unit that determines, on a basis of the output erase information, whether or not to count the erase processing as the number of rewrite cycles of each of the pages; and a number-of-rewrite-cycles management unit that updates and retains the number of rewrite cycles for each of the pages on a basis of a result of the determination. With this, there is provided an action that, on a basis of the erase information output from the memory to the counting-of-number-of-rewrite-cycles determination unit, the number of times the erase processing has been performed is added up for each page. That is, there is provided an action that the storage apparatus knows that the erase processing has been performed in the memory and counts the number of rewrite cycles.

Further, in this third aspect, the memory may further output program information that is information regarding whether or not the program processing has been performed in the writing. The storage apparatus may further include a program information retention unit that retains the output program information for each of the pages. The counting-of-number-of-rewrite-cycles determination unit may determine that the erase processing is to be counted as the number of rewrite cycles of the page, on a basis of the erase information output in a case where the program information retained when the writing is continuously performed on an identical page of the pages indicates execution of the program processing. With this, there is provided an action that, on a basis of the erase information output in a case where the program information retained by the memory controller indicates execution of the program processing, the number of times the erase processing has been performed is added up for each page. That is, there is provided an action that the number of rewrite cycles is counted in a case where the program processing and the erase processing have been sequentially executed in the continuous writing in the identical page.

Further, a fourth aspect of the present technology is an information processing system including: a storage apparatus including a memory that outputs erase information that is information regarding whether or not erase processing has been performed on a memory cell in a page in writing of data in units of pages each including a plurality of memory cells in which data is rewritten by program processing of shifting the memory cell that stores data from an initial state to a data-storing state and erase processing of shifting the memory cell from the data-storing state to the initial state, a counting-of-number-of-rewrite-cycles determination unit that determines, on a basis of the output erase information, whether to count the erase processing as the number of rewrite cycles of each of the pages, and a number-of-rewrite-cycles management unit that retains a result of updating the number of rewrite cycles for each of the pages on a basis of a result of the determination; and a host computer that accesses the storage apparatus. With this, there is provided an action that, on a basis of the erase information output from the memory to the counting-of-number-of-rewrite-cycles determination unit, the number of times the erase processing has been performed is added up for each page. That is, there is provided an action that the information processing system knows that the erase processing has been performed in the memory and counts the number of rewrite cycles.

Advantageous Effects of Invention

In accordance with the present technology, an excellent effect of enhancing the accuracy of counting the number of rewrite cycles in the non-volatile memory that is overwritable can be exerted. It should be noted that the effects described here are not necessarily limitative and any effect described in the present disclosure may be provided.

BRIEF DESCRIPTION OF DRAWINGS

FIG. 7 A diagram showing an example of the number of rewrite cycles in the first embodiment of the present technology.

FIG. 14 A diagram showing an example of the counting-of-number-of-rewrite-cycle determination in the second embodiment of the present technology.

FIG. 15 A diagram showing a condition of the counting-of-number-of-rewrite-cycle determination in the second embodiment of the present technology.

FIG. 20 A diagram showing an example of program information in the third embodiment of the present technology.

FIG. 21 A diagram showing an example of the counting-of-number-of-rewrite-cycle determination in the third embodiment of the present technology.

MODE(S) FOR CARRYING OUT THE INVENTION

Hereinafter, modes for carrying out the present technology (hereinafter, referred to as embodiments) will be described. Descriptions will be made in the following order.

1. First Embodiment (example in case of performing determination as to counting of number of rewrite cycles on basis of erase information)

2. Second Embodiment (example in case of performing determination as to counting of number of rewrite cycles on basis of erase information and program information)

3. Third Embodiment (example in case of performing determination as to counting of number of rewrite cycles for each of regions obtained by dividing page)

4. Fourth Embodiment (example in case of utilizing number-of-rewrite-cycle information for replacement processing)

5. Fifth Embodiment (example in case of utilizing number-of-rewrite-cycle information for wear leveling processing)

6. Sixth Embodiment (example in case where memory 300 includes counting-of-number-of-rewrite-cycles determination unit)

1. First Embodiment

[Configuration of Information System]

Figure 1:
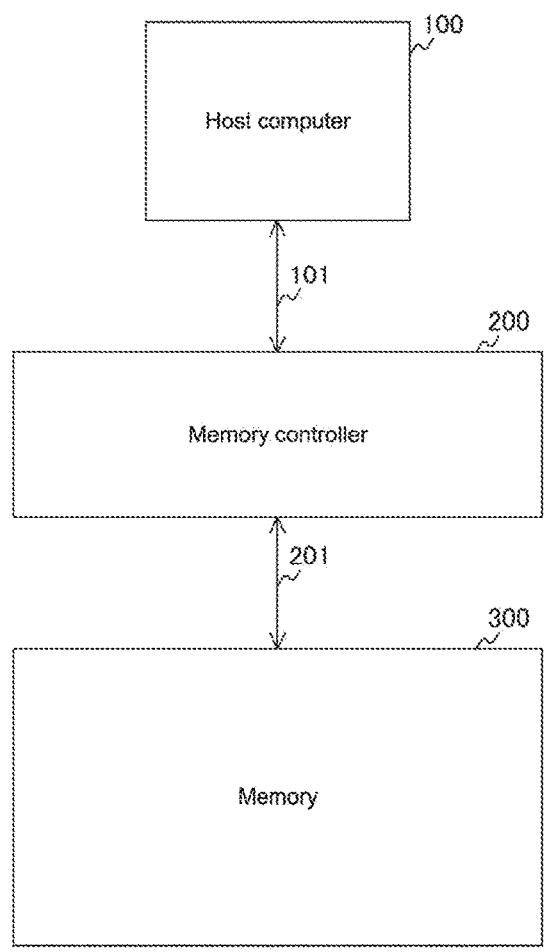
FIG. 1 A diagram showing a configuration example of an information processing system in an embodiment of the present technology.

FIG. 1 is a diagram showing a configuration example of an information processing system in an embodiment of the present technology. The information processing system includes a host computer 100, a memory controller 200, and a memory 300. Note that the memory controller 200 and the memory 300 constitutes a storage apparatus.

The host computer 100 performs various types of processing in the information processing system. This host computer 100 issues a command to write or read, for example, to the memory 300 via the memory controller 200, and performs access.

The memory controller 200 controls the memory 300. This memory controller 200 interprets the write and read commands issued by the host computer 100, and gives write and read requests based thereon to the memory 300.

The memory 300 saves data. This data is accessed on a basis of the request given by the memory controller 200. At this time, the data is transferred between the memory 300 and the memory controller 200. Note that it is assumed that the memory 300 is a memory that is a nonvolatile memory such as an EEPROM, a ReRAM, a PCRAM, and an MRAM, and further capable of rewriting by overwriting data without erasing a memory cell.

A signal line 101 electrically connects the host computer 100 and the memory controller 200 to each other. Further, a signal line 201 electrically connects the memory controller 200 and the memory 300 to each other.

For writing, the host computer 100 issues a write command and write data, an address of a writing destination, and the number of write data items, which are associated therewith, to the memory controller 200. The memory controller 200 interprets the issued write command, and gives a write request to the memory 300 on a basis of the write data, the address of the writing destination, and the number of write data items, which are associated therewith. The memory 300 performs writing on a basis of this request. After that, the memory 300 outputs a result of the writing as a status to the memory controller 200. The memory controller 200 outputs a result of the writing as a response to the host computer 100 on a basis of this status.

On the other hand, for reading, the host computer 100 issues a read command, and an address of a reading destination and the number of read data items, which are associated therewith, to the memory controller 200. The memory controller 200 interprets this command, and gives a read request to the memory 300 on a basis of the address of the reading destination and the number of read data items, which are associated therewith. The memory 300 performs reading on a basis of this request, and outputs read data to the memory controller 200. The memory controller 200 outputs this output data as read data to the host computer 100. The memory controller 200 outputs a result of the reading as a response to the host computer 100.

[Configuration of Memory Controller]

Figure 2:
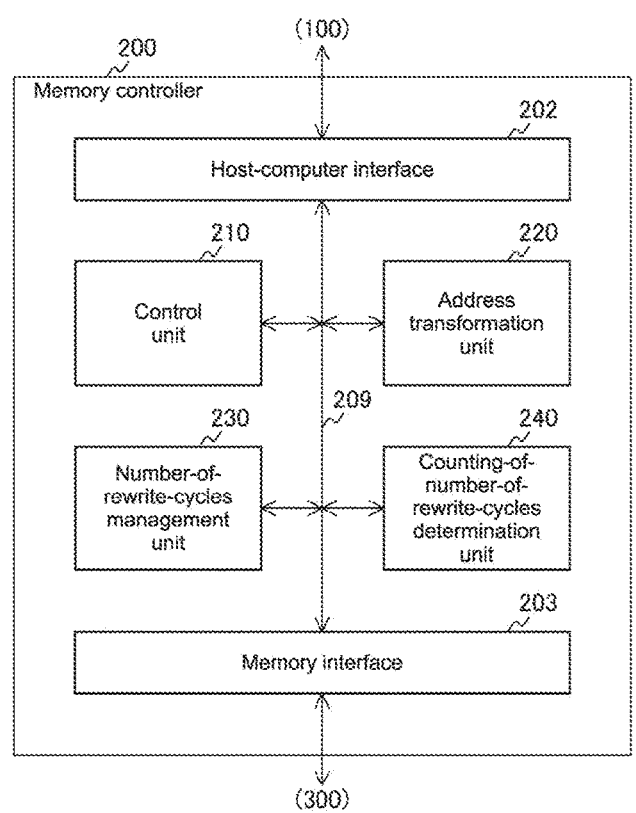
FIG. 2 A diagram showing a configuration example of a memory controller 200 in a first embodiment of the present technology.

FIG. 2 is a diagram showing a configuration example of a memory controller 200 in the first embodiment of the present technology. This memory controller 200 includes a host-computer interface 202, a control unit 210, an address transformation unit 220, a number-of-rewrite-cycles management unit 230, a counting-of-number-of-rewrite-cycles determination unit 240, and a memory interface 203.

The host-computer interface 202 is an interface to communicate with the host computer 100. The memory interface 203 is an interface to communicate with the memory 300.

The control unit 210 generally controls the memory controller 200. Further, this control unit 210 performs processing of generating a request to the memory 300 on a basis of a command input by the host computer 100 and outputting the result to the host computer 100.

The address transformation unit 220 transforms a logic address that is an address included in the command issued by the host computer 100 into a physical address that is an address in the memory 300. This address transformation unit 220 includes an address transformation table indicating the correspondence between the logic address and the physical address. Such transformation is performed by this address transformation unit 220 on a basis of this address transformation table. As will be described later, the memory 300 is accessed in accordance with a page address in units of pages. Therefore, the address transformation unit 220 transforms the logic address into the physical address including the page address.

The number-of-rewrite-cycles management unit 230 retains the number of rewrite cycles for each page in the memory 300. This number-of-rewrite-cycles management unit 230 further performs processing of updating the number of rewrite cycles for each page, on a basis of determination information output as a result of the determination by the counting-of-number-of-rewrite-cycles determination unit 240 as will be described later. Here, the determination information is information for update instruction of the number of rewrite cycles. Further, the number of rewrite cycles can be updated by, for example, adding the value "1" to the number of rewrite cycles of a target page.

The counting-of-number-of-rewrite-cycles determination unit 240 determines whether or not to update the number of rewrite cycles in the memory 300. This counting-of-number-of-rewrite-cycles determination unit 240 determines whether or not it is necessary to update the number of rewrite cycles retained in the number-of-rewrite-cycles management unit 230 for each page. Then, if the updating is necessary, the counting-of-number-of-rewrite-cycles determination unit 240 generates determination information and outputs the determination information to the number-of-rewrite-cycles management unit 230 to update the number of rewrite cycles. The determination as to whether or not the updating is necessary in the counting-of-number-of-rewrite-cycles determination unit 240 will be described later in detail.

When the host computer 100 issues a command, this command is transferred to the control unit 210 by the host-computer interface 202. The control unit 210 generates a request on a basis of this command. At this time, the address transformation unit 220 transforms a logic address included in the command into a physical address. After that, the generated request is output to the memory 300 via the memory interface 203. Further, when the memory 300 outputs a status, this status is transferred to the control unit 210 by the memory interface 203. The control unit 210 generates a response on a basis of the status, and outputs the response to the host computer 100 via the host-computer interface 202.

[Configuration of Memory]

Figure 3:
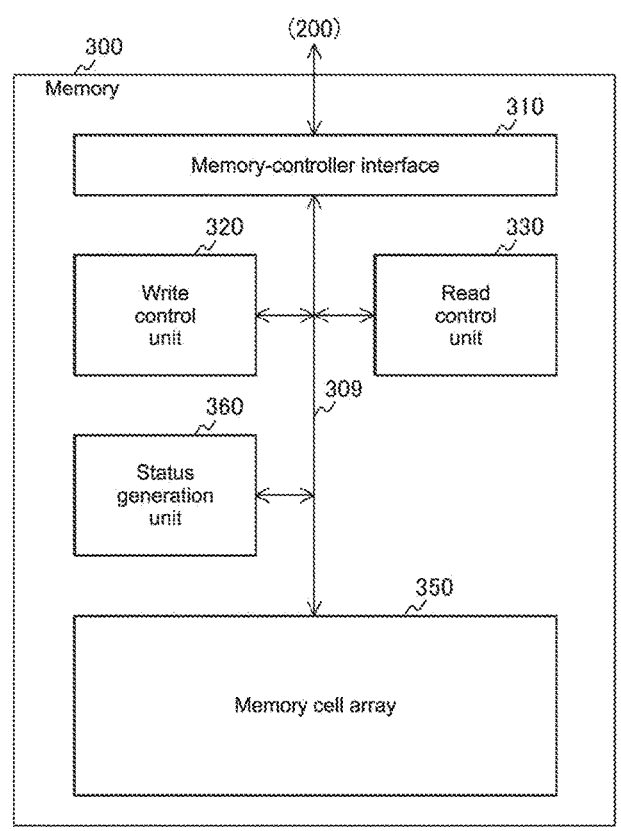
FIG. 3 A diagram showing a configuration example of a memory 300 in the first embodiment of the present technology.

FIG. 3 is a diagram showing a configuration example of a memory 300 in the first embodiment of the present technology. This memory 300 includes a memory-controller interface 310, a write control unit 320, a read control unit 330, a status generation unit 360, and a memory cell array 350.

The memory-controller interface 310 is an interface to communicate with the memory controller 200.

The memory cell array 350 is configured in such a manner that memory cells that store data are two-dimensionally or three-dimensionally arranged. As described above, it is assumed that this memory cell is a memory cell including an ReRAM. The memory cell will be described later in detail.

The write control unit 320 writes data in units of pages in the memory cell array 350 on a basis of the write request. This write control unit 320 performs writing in the memory cell array 350 by performing program processing or erase processing to be described later. The size of the page can be, for example, 2 kilobytes.

The read control unit 330 reads data in units of pages from the memory cell array 350 on a basis of the read request.

The status generation unit 360 generates a status on a basis of a result of the request. This status generation unit 360 generates the result of the request and erase information that is information regarding whether or not the erase processing based on the write request has been performed, as the status. The status will be described later in detail.

When a write request is given by the memory controller 200, this write request is transferred to the write control unit 320 by the memory-controller interface 310. The write control unit 320 performs writing in the memory cell array 350 on a basis of this request. Similarly, when a read request is given by the memory controller 200, this read request is transferred to the read control unit 330, and reading from the memory cell array 350, which is based thereon, is performed. On a basis of these results of writing and reading, a status is generated by the status generation unit 360, and output to the memory controller 200 via the memory-controller interface 310.

[Configuration of Memory Cell]

Figure 4:
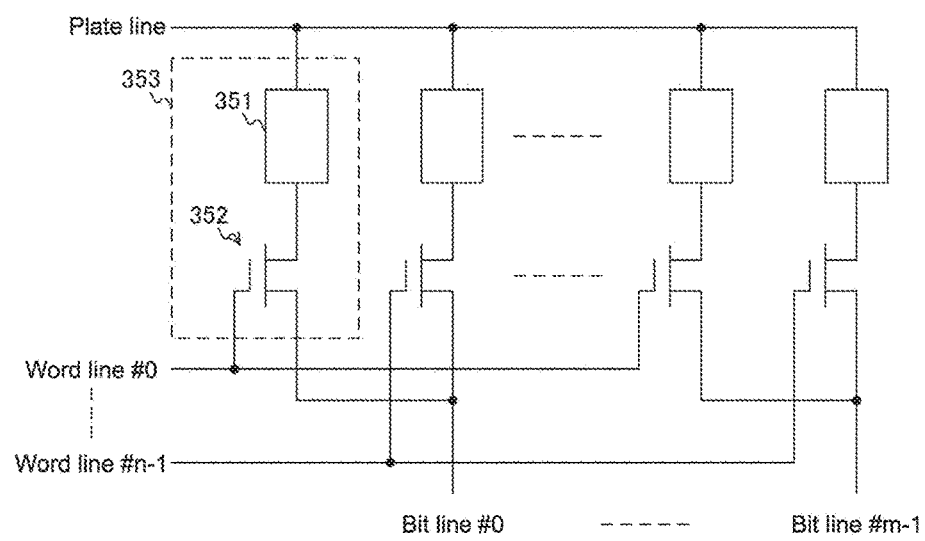
FIG. 4 A diagram showing an example of a configuration of an example of a memory cell in the embodiment of the present technology.

FIG. 4 is a diagram showing an example of a configuration of a memory cell in the embodiment of the present technology. The figure shows a configuration of one of memory cells two-dimensionally arranged in the memory cell array 350 described in FIG. 3. As shown in the figure, one-bit memory cell 353 is including a storage element 351 and a MOS transistor 352. The storage element 351 is a variable-resistance element that stores data. The MOS transistor 352 is a transistor that drives the storage element 351.

One end of the storage element 351 is connected to a plate line that is a common signal line. The other end of the storage element 351 is connected to a drain terminal of the MOS transistor 352. A gate terminal of the MOS transistor 352 is connected to one of a plurality of word lines. A source terminal of the MOS transistor 352 is connected to one of a plurality of bit lines. The word lines and the bit lines are arrayed in an XY-matrix form with respect to the MOS transistor 352 that constitutes the memory cell 353. With this, one memory cell 353 is selected and data is written or read by selecting one of the word lines and one of the bit lines and inputting signals. For example, when the memory cell 353 described at the far left of the figure is selected, the word line #0 and the bit line #0 are selected.

The storage element 351 is an element that stores data. This storage element 351 has a resistance value variable depending on polarity of applied voltage. As the initial state, the storage element 351 is in a high-resistance state. The storage element 351 can be put into a low-resistance state by applying, on the storage element 351 in the initial state, voltage (write voltage) having negative polarity for other terminals of the storage element 351 with reference to a terminal of the storage element 351, which is connected to the plate line, for example. When write voltage having inverse polarity is applied on the storage element 351 in this low-resistance state, the storage element 351 is returned to the high-resistance state again. Note that, in the following description, the high-resistance state will be referred to as an HRS (High Resistance State) and the low-resistance state will be referred to as an LRS (Low Resistance State). While these HRS and LRS are associated with logic values, data is stored. For example, a case where the storage element 351 is in the HRS can be represented by a value "0" and a case where the storage element 351 is in the LRS can be represented by a value "1". By reversibly changing the resistance value of the storage element 351 in the above-mentioned manner, data can be written in the memory cell 353.

On the other hand, it can also be considered that a state of the memory cell 353 whose storage element 351 is in the HRS is an initial state and a state in which the storage element 351 of the memory cell 353 in this initial state is changed into the LRS is a data-storing state. In this case, regarding the number of rewrite cycles of data in the memory cell 353, a cycle in which the memory cell 353 in the initial state is put into the data-storing state and returned to the initial state can be counted as one cycle. In the above-mentioned example, when the value "1" is written in the memory cell 353, in which the value "0" has been written, and then the value "0" is written again, the number of rewrite cycles of the memory cell 353 can be counted as one cycle. Here, processing of shifting the memory cell from the initial state to the data-storing state will be referred to as program processing and processing of shifting the memory cell from the data-storing state to the initial state will be referred to as erase processing. Thus, when the program processing and the erase processing are sequentially performed on the memory cell 353 in the initial state, the number of rewrite cycles can be counted as one cycle.

Note that these program processing and erase processing are simultaneously performed on a plurality of memory cells 353. In order to perform program processing, one of the plurality of word lines is selected. For example, the word line #0 is selected, and ON-voltage is applied. With this, the MOS transistor 352 connected to the word line #0 is put into an ON-state. Next, a bit line connected to the memory cell 353 on which the program processing is to be performed is selected, and write voltage having negative polarity is applied on the plate line. Thus, the storage element 351 of the memory cell 353 connected to the selected bit line is put into the LRS, and the value "1" is written. In order to perform erase processing, the word line #0 is selected and ON-voltage is applied as in the program processing. Next, a bit line connected to the memory cell 353 on which the erase processing is to be performed is selected, and write voltage having positive polarity is applied on the plate line. Thus, the storage element 351 of the memory cell 353 connected to the selected bit line is put into the HRS, and the value "0" is written.

In this manner, writing can be performed on a plurality of memory cells connected to one word line. The number of memory cells 353 writable in this one write operation corresponds to the above-mentioned page size. That is, in the memory 300, writing of data is performed in units of pages. It is assumed that the page size is m-bits in the example shown in the figure.

By the way, it is known that, in a non-volatile memory like an ReRAM, the storage element 351 is gradually degraded every time rewriting is performed. When the degradation progresses in the storage element 351, it becomes impossible to perform normal writing and reading. Therefore, in a system using such a non-volatile memory, the reliability in storing data is gradually lowered. In view of this, the number of cycles in which data is rewritable in the memory cell can be set by determining the relationship between the progress of the degradation and the number of rewrite cycles. The reliability of the memory can be enhanced by counting the number of rewrite cycles of the memory cell and taking a measure of, for example, prohibiting the use of that memory cell when the number of rewrite cycles counted exceeds the set number of cycles in which data is rewritable. Therefore, it is necessary to accurately count the number of rewrite cycles.

[Write Operation]

Figure 5:
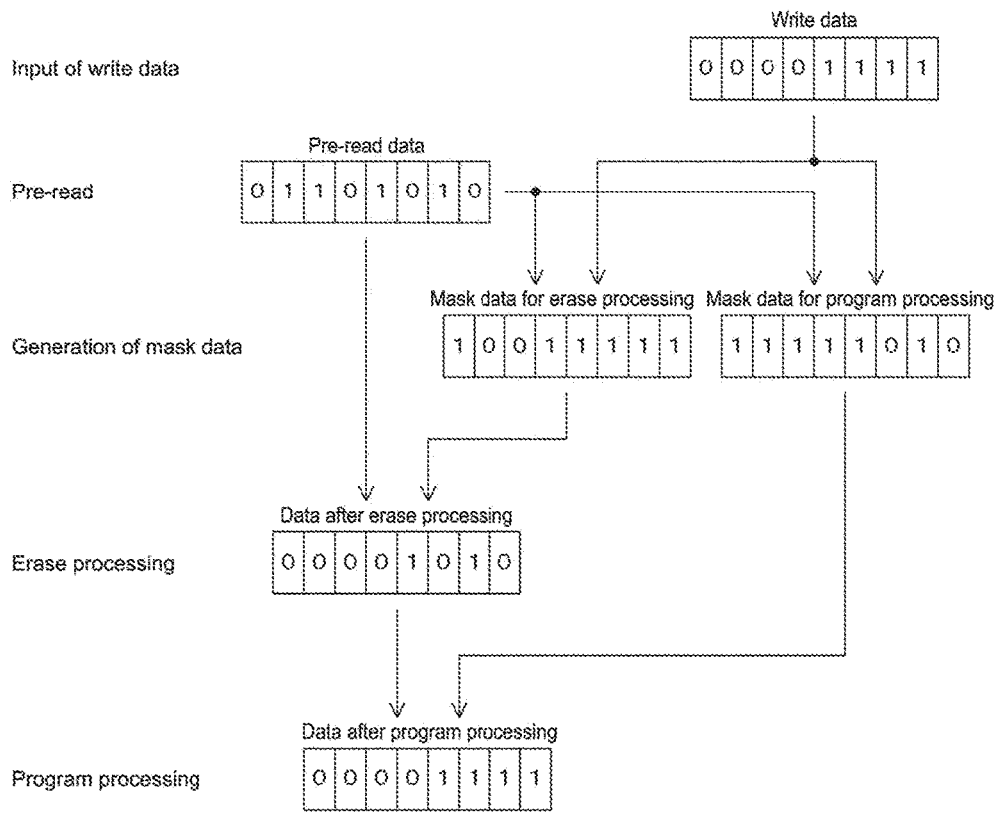
FIG. 5 A diagram showing writing of data in the embodiment of the present technology.

FIG. 5 is a diagram showing writing of data in the embodiment of the present technology. The figure shows a write operation in units of pages. For the sake of convenience, it is assumed that the page size is 8 bits. As described in FIG. 4, the writing is performed by the program processing and the erase processing. Such processing is performed by using mask data for determining a position of a bit that is a target. Mask data corresponding to the program processing and mask data corresponding to the erase processing are called program mask and erase mask, respectively. In the mask data in the figure, the position of the bit that is a target is determined by the use of a bit of the value "0". The write operation will be described assuming a case where write data shown in the figure has been input.

First of all, pre-reading of reading data stored in a write-target page is performed. Next, mask data is generated on a basis of pre-read data and the write data. The pre-read data is the data read by pre-reading. Mask data for program processing can be generated in accordance with the following equation.

$$PMask = R | {\sim}W$$

It should be noted that PMask indicates the mask data for program processing. R indicates the pre-read data. W indicates the write data. Further, | and ~ are operators representing an OR operation for each bit and a NOT operation for each bit, respectively. Further, mask data for erase processing can be generated in accordance with the following equation.

$$EMask = {\sim}R | W$$

It should be noted that EMask indicates the mask data for erase processing.

Next, the erase processing and the program processing based on the mask data for erase processing and the mask data for program processing are sequentially performed. By these operations, writing is performed. In this writing, if all the generated bits of PMask are the value "1", the program processing is not performed. Similarly, if all the bits of EMask are the value "1", the erase processing is not performed.

[Configuration of Status]

Figure 6:
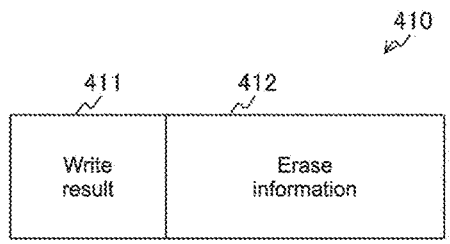
FIG. 6 A diagram showing a configuration example of a status in the first embodiment of the present technology.

FIG. 6 is a diagram showing a configuration example of the status in the first embodiment of the present technology. The figure shows a configuration of the status generated by the status generation unit 360 on a basis of a result of the write request. The status 410 in the figure includes a write result 411 and erase information 412. The write result 411 is information indicating whether or not the write request has succeeded. As this write result 411, the value "1" can be applied if the writing has succeeded, and the value "0" can be applied if the writing has failed, for example. The erase information 412 is information indicating whether or not the above-mentioned erase processing has been performed in the write request. As in the write result 411, as the erase information 412, the value "1" can be applied if the erase processing has been performed, and the value "0" can be applied if the erase processing has not been performed, for example. Further, for example, the number of bits, on which the erase processing has been performed, can also be used as the erase information 412.

As described in FIG. 5, for writing in the ReRAM, the program processing or the erase processing is performed on a basis of the write data and the pre-read data. In view of this, if this erase processing has been performed, the status generation unit 360 generates erase information 412, and outputs the erase information 412 to the memory controller 200 as part of the status 410. With this, the memory controller 200 is capable of knowing that the erase processing has been performed in the memory 300.

[Number of Rewrite Cycles]

FIG. 7 is a diagram showing an example of the number of rewrite cycles in the first embodiment of the present technology. The number of rewrite cycles in the figure shows the number of rewrite cycles retained in the number-of-rewrite-cycles management unit 230. In this manner, the number of rewrite cycles is retained in the number-of-rewrite-cycles management unit 230 for each page.

[Counting of Number of Rewrite Cycles]

As described above, on a basis of the erase information 412 of the status output from the memory 300, the memory controller 200 is capable of knowing whether or not the erase processing has been performed in the memory 300. Then, if the erase processing has been performed, the number of rewrite cycles can be updated assuming that rewriting has been performed in the corresponding page. If the program processing and the erase processing have been sequentially performed in the memory cell, it is counted as one rewrite cycle. In the first embodiment of the present technology, the number of rewrite cycles in units of pages is managed. Therefore, if the erase processing has been performed in the memory 300, the number of rewrite cycles is updated assuming that the rewriting has been performed in the corresponding page.

If the erase processing has been performed in the memory 300 on a basis of the erase information output from the memory 300, the counting-of-number-of-rewrite-cycles determination unit 240 described in FIG. 2 performs determination as to updating of the number of rewrite cycles for each page. Specifically, the updating can be performed as follows. First of all, the erase information 412 of the status 410 output by the memory 300 is transferred to the counting-of-number-of-rewrite-cycles determination unit 240. The counting-of-number-of-rewrite-cycles determination unit 240 refers to the transferred erase information 412, and determines whether or not the erase processing has been performed in the memory 300. If the erase processing has been performed, the counting-of-number-of-rewrite-cycles determination unit 240 outputs the determination information to the number-of-rewrite-cycles management unit 230. Next, the number-of-rewrite-cycles management unit 230 into which the determination information has been input adds the value "1" to the number of rewrite cycles of the corresponding page, and retains it. With this, the number of rewrite cycles is updated, and counting of the number of rewrite cycles in the memory controller 200 is performed.

[Processing Procedure of Write Processing]

Figure 8:
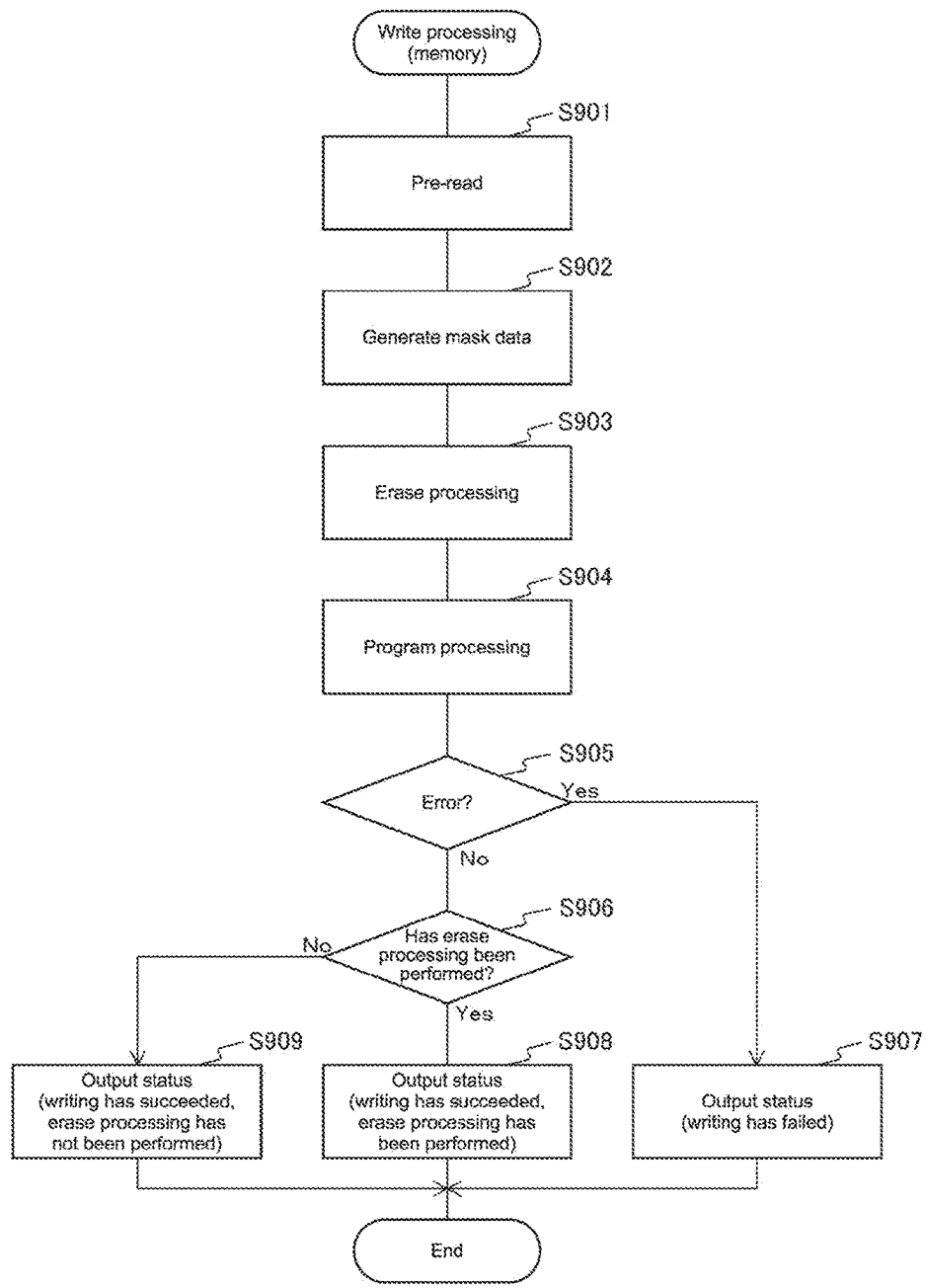
FIG. 8 A diagram showing an example of a processing procedure of write processing (memory 300) in the first embodiment of the present technology.

FIG. 8 is a diagram showing an example of a processing procedure of write processing (memory 300) in the first embodiment of the present technology. The processing in the figure shows the write processing in the memory 300. When the write request is given by the memory controller 200, this processing is executed. First of all, the write control unit 320 performs pre-reading based on a page address of a writing destination of the write request, on the memory cell array 350 (Step S901). Next, the write control unit 320 generates mask data on a basis of the pre-read data and the write data (Step S902). Next, the write control unit 320 performs erase processing on a basis of the mask data (Step S903), and performs program processing (Step S904).

Next, the status generation unit 360 determines whether or not an error has occurred in such processing (Step S905). If the error has occurred (Step S905: Yes), the status generation unit 360 generates a write result 411 indicating writing failure as a status, and outputs the write result 411 to the memory controller 200 (Step S907).

On the other hand, if the error has not occurred (Step S905: No), the status generation unit 360 determines whether or not the erase processing has been performed in Step S903 (Step S906). If the erase processing has been performed (Step S906: Yes), the status generation unit 360 generates the write result 411 indicating writing success and the erase information 412 indicating that the erase processing has been performed, as a status. Next, the status generation unit 360 outputs the generated status to the memory controller 200 (Step S908). On the other hand, if the erase processing has not been performed (Step S906: No), the status generation unit 360 generates the write result 411 indicating writing success and the erase information 412 indicating that the erase processing has not been performed, as a status. Next, the status generation unit 360 outputs the generated status to the memory controller 200 (Step S909). After the status is output, this processing is terminated.

[Processing Procedure of Write Processing]

Figure 9:
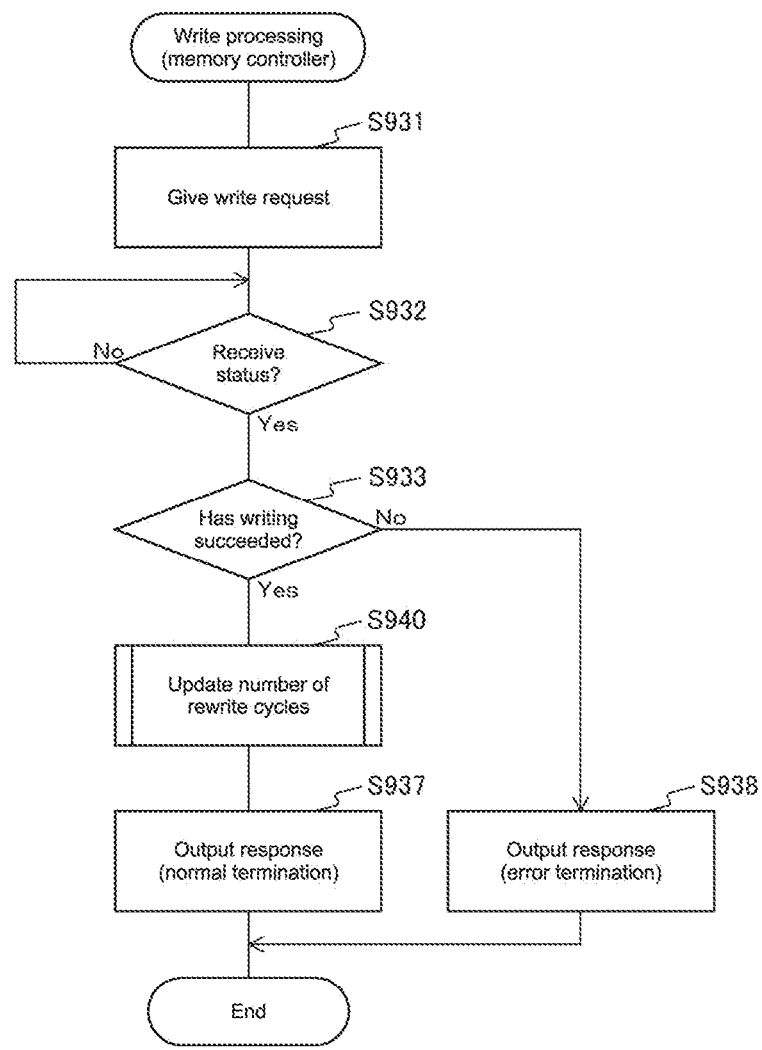
FIG. 9 A diagram showing an example of a processing procedure of write processing (memory controller 200) in the first embodiment of the present technology.

FIG. 9 is a diagram showing an example of a processing procedure of write processing (memory controller 200) in the first embodiment of the present technology. The processing in the figure shows the write processing in the memory controller 200. When a write command is issued by the host computer 100, this processing is executed. First of all, the control unit 210 generates a write request on a basis of the write command, and gives the write request to the memory 300 (Step S931). Next, the control unit 210 stands by until it receives the status from the memory 300 (Step S932: No). When the status is received, the control unit 210 determines whether or not the writing has succeeded on a basis of this received status (Step S933). As a result, if the writing has failed (Step S933: No), the control unit 210 outputs to a response indicating the fact that the write command has been terminated due to an error, to the host computer 100 (Step S938), and terminates the write processing.

On the other hand, if the writing has succeeded (Step S933: Yes), number-of-rewrite-cycles update processing is executed (Step S940). Next, the control unit 210 outputs a response indicating the fact that the write command has been normally terminated, to the host computer 100 (Step S937), and terminates the write processing.

[Processing Procedure of Number-of-Rewrite-Cycle Update Processing]

Figure 10:
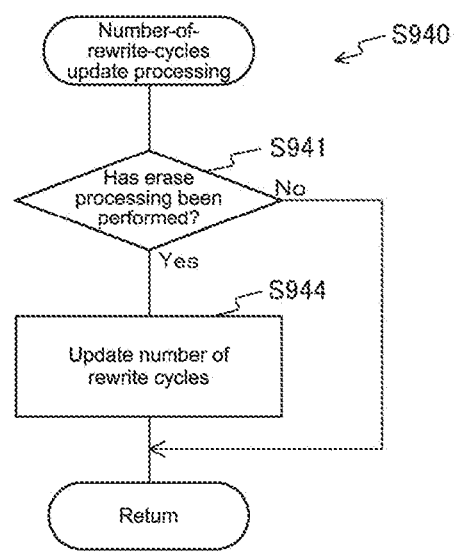
FIG. 10 A diagram showing an example of a processing procedure of number-of-rewrite-cycles update processing (Step S940) in the first embodiment of the present technology.

FIG. 10 is a diagram showing an example of a processing procedure of the number-of-rewrite-cycles update processing (Step S940) in the first embodiment of the present technology. The processing in the figure shows processing corresponding to the number-of-rewrite-cycles update processing (Step S940) in FIG. 9. First of all, the counting-of-number-of-rewrite-cycles determination unit 240 determines the presence/absence of the erase processing in the memory 300 on a basis of the received status (Step S941). As a result, if the erase processing has not been performed (Step S941: No), the counting-of-number-of-rewrite-cycles determination unit 240 terminates this processing without updating the number of rewrite cycles.

On the other hand, if the erase processing has been performed (Step S941: Yes), the number of rewrite cycles is updated (Step S944). That is, the value "1" is added to the number of rewrite cycles of the corresponding page. This can be performed in such a manner that the counting-of-number-of-rewrite-cycles determination unit 240 outputs the determination information to the number-of-rewrite-cycles management unit 230. After that, the counting-of-number-of-rewrite-cycles determination unit 240 terminates this processing.

In this manner, in the first embodiment of the present technology, the erase information indicating execution of the erase processing of shifting the memory cell from the data-storing state to the initial state at the time of writing is output from the memory 300 to the memory controller 200. On a basis of this erase information, the memory controller 200 counts the number of rewrite cycles. Therefore, it is possible to accurately count the number of rewrite cycles of the memory 300 including the non-volatile memory.

2. Second Embodiment

In the above-mentioned first embodiment, the number of rewrite cycles is counted on a basis of the erase information. In contrast, in a second embodiment of the present technology, the number of rewrite cycles is counted on a basis of the erase information and the program information. With this, the accuracy of counting the number of rewrite cycles is enhanced.

[Configuration of Memory Controller]

Figure 11:
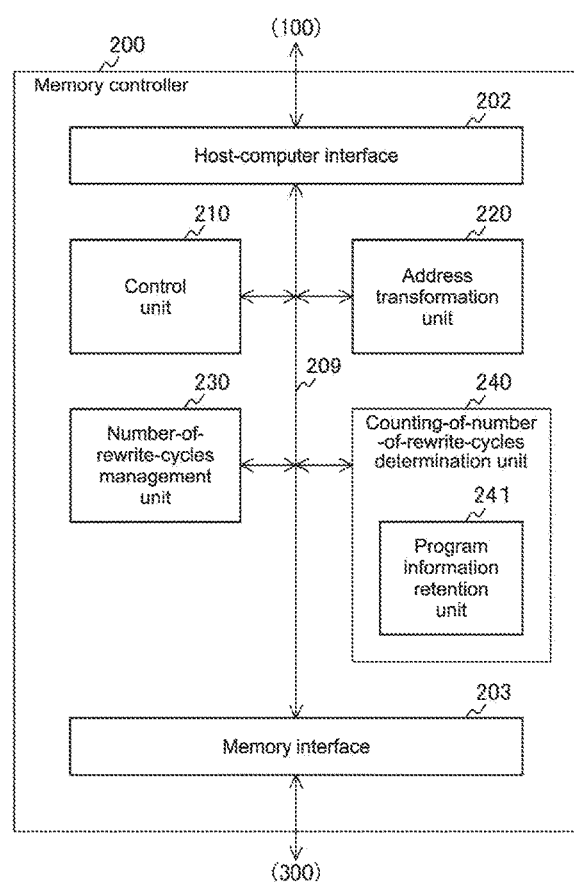
FIG. 11 A diagram showing a configuration example of a memory controller 200 in a second embodiment of the present technology.

FIG. 11 is a diagram showing a configuration example of a memory controller 200 in the second embodiment of the present technology. This memory controller 200 is different from the memory controller 200 described in FIG. 2 in that the counting-of-number-of-rewrite-cycles determination unit 240 includes a program information retention unit 241.

The program information retention unit 241 retains program information for each page. Here, the program information is information indicating whether or not the program processing has been performed in the memory 300 at the time of write request.

The counting-of-number-of-rewrite-cycles determination unit 240 in the figure determines that the erase processing is to be counted as the number of rewrite cycles in a case where the program information retained in the program information retention unit 241 when writing is continuously performed on an identical page indicates execution of the program processing. This determination in the counting-of-number-of-rewrite-cycles determination unit 240 will be described later in detail.

[Configuration of Status]

Figures 12, 13:
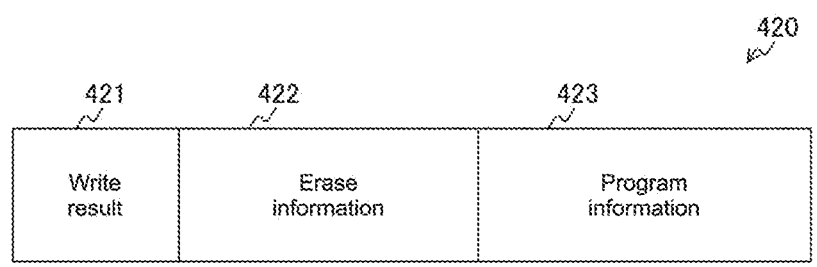
FIG. 12 A diagram showing a configuration example of a status in the second embodiment of the present technology.
FIG. 13 A diagram showing an example of program information in the second embodiment of the present technology.

FIG. 12 is a diagram showing a configuration example of a status in the second embodiment of the present technology. A status 420 in the figure shows a configuration of the status generated by the status generation unit 360 of the memory 300 in the second embodiment. This status 420 includes a write result 421, erase information 422, and program information 423. The write result 421 and the erase information 422 are similar to the write result 411 and the erase information 412 described in FIG. 6, and hence descriptions thereof will be omitted. As the program information 423 in the figure, the value "1" can be applied if the program processing has been performed, and the value "0" can be applied if the program processing has not been performed, for example. Further, for example, the number of bits, on which the program processing has been performed, can also be used as the program information 423.

[Program Information]

FIG. 13 is a diagram showing an example of program information in the second embodiment of the present technology. The figure shows the program information retained in the program information retention unit 241. In the second embodiment of the present technology, the counting-of-number-of-rewrite-cycles determination unit 240 determines that the erase processing is to be counted as the number of rewrite cycles, on a basis of the erase information and the program information. That is, the program information is information used for determination as to counting of the number of rewrite cycles, and hence a configuration in which the program information retention unit 241 is included in the counting-of-number-of-rewrite-cycles determination unit 240 can be employed.

The control unit 210 of the memory controller 200 in the second embodiment of the present technology transfers the program information 423 included in the status output from the memory 300 to the counting-of-number-of-rewrite-cycles determination unit 240. After that, the counting-of-number-of-rewrite-cycles determination unit 240 causes the program information retention unit 241 to retain the transferred program information.

The counting-of-number-of-rewrite-cycles determination unit 240 determines whether or not the program processing has been performed, on a basis of the program information retained in the program information retention unit 241 when writing is continuously performed on an identical page. Then, if the program processing has been performed, the counting-of-number-of-rewrite-cycles determination unit 240 determines that the erase processing is to be counted as the number of rewrite cycles, on a basis of the erase information output from the memory 300. Specifically, counting of the number of rewrite cycles is performed as follows. First of all, the counting-of-number-of-rewrite-cycles determination unit 240 refers to the erase information 422, and determines whether or not the erase processing has been performed in the memory 300. As a result, if the erase processing has been performed, the counting-of-number-of-rewrite-cycles determination unit 240 refers to the program information retained in the program information retention unit 241, and determines whether or not the program processing has been performed at the last time of writing in the identical page. As a result, if the program processing has been performed, the counting-of-number-of-rewrite-cycles determination unit 240 outputs the determination information to the number-of-rewrite-cycles management unit 230 to update the number of rewrite cycles of the corresponding page. Thus, the memory controller 200 can count the number of rewrite cycles.

Configurations of the memory controller 200 and the memory 300 other than this are similar to those of the memory controller 200 and the memory 300 described in FIGS. 2 and 3, and hence descriptions thereof will be omitted. Note that the configuration of the memory controller 200 in the second embodiment of the present technology is not limited to the above-mentioned configuration. For example, it is also possible to use a system in which the program information retention unit 241 is included in the number-of-rewrite-cycles management unit 230.

[Determination as to Counting of Number of Rewrite Cycles]

FIG. 14 is a diagram showing an example of the determination as to counting of the number of rewrite cycles in the second embodiment of the present technology. The figure shows a relationship between the number of bits of the erase processing, the number of bits of the program processing, the program information, and the number of rewrite cycles in a case where write requests for an identical page have been continuous. For the sake of convenience, it is assumed that the page size is 8 bits. Data in the figure indicates data of the page after execution of the write requests. Further, the program information in the figure is program information retained in the program information retention unit 241. The program information in the figure indicates a case where the program processing has been performed, as the value "1", and indicates a case where the program processing has not been performed, as the value "0". The number of rewrite cycles in the figure indicates a state in which the number of rewrite cycles is updated. A case where the value "1" is added to the number of rewrite cycles is indicated by "+1".

It is assumed that, in the initial state, the data stored in the page is 0b11111111, and the program information is the value "1". In this state, when 0b00000000 is written on a basis of a write request 1, the number of bits of the erase processing and the number of bits of the program processing respectively become the value "8" and the value "0". In this case, the erase processing has been performed, and the program information (before execution) is the value "1", and hence the number of rewrite cycles is updated. Further, the program processing has not been performed, and hence the program information changes from the value "1" to the value "0".

When 0b11111111 is written on a basis of a next write request 2, the number of bits of the erase processing and the number of bits of the program processing respectively become the value "0" and the value "8". In this case, the erase processing has not been performed, and hence the number of rewrite cycles does not change. Further, the program processing has been performed, and hence the program information changes from the value "0" to the value "1".

When 0b00111111 is written on a basis of a next write request 3, the number of bits of the erase processing and the number of bits of the program processing respectively become the value "2" and the value "0". As in the case of the write request 1, the number of rewrite cycles is updated, and the program information changes from the value "1" to the value "0".

When 0b00001111 is written on a basis of a next write request 4, the number of bits of the erase processing and the number of bits of the program processing respectively become the value "2" and the value "0". In this case, the erase processing has been performed and the program information (before execution) is the value "0", and hence the number of rewrite cycles does not change. Further, the program processing has not been performed, and hence the program information is still the value "0".

When 0b00000011 is written on a basis of a next write request 5, the number of bits of the erase processing and the number of bits of the program processing respectively become the value "2" and the value "0". As in the case of the write request 4, the number of rewrite cycles does not change, and the program information is still the value "0".

When 0b11000000 is written on a basis of a next write request 6, the number of bits of the erase processing and the number of bits of the program processing both become the value "2". The program information (before execution) is the value "0", and hence the number of rewrite cycles does not change. Further, the program information changes from the value "0" to the value "1".

A next write request 7 is related to a case where the data stored in the page before this writing is identical to the write data. The number of bits of the erase processing and the number of bits of the program processing both become the value "0". In such a case where both of the erase processing and the program processing have not been performed, the number of rewrite cycles and the program information do not change. In such a case, it is considered that no write requests have been given.

When 0b00000000 is written on a basis of a next write request 8, the number of bits of the erase processing and the number of bits of the program processing respectively become the value "2" and the value "0". As in the write request 1, the number of rewrite cycles is updated, and the program information changes from the value "1" to the value "0".

A next write request 9 is related to a case where, as in the write request 7, the data stored in the page before this writing is identical to the write data, and the number of rewrite cycles and the program information do not change.

When 0b00001111 is written on a basis of a next write request 10, the number of bits of the erase processing and the number of bits of the program processing respectively become the value "0" and the value "4". The erase processing has not been performed, and hence the number of rewrite cycles does not change. Further, the program information changes from the value "0" to the value "1".

When 0b11110000 is written on a basis of a next write request 11, the number of bits of the erase processing and the number of bits of the program processing both become the value "4". The erase processing has been performed, and the program information (before execution) is the value "1", and hence the number of rewrite cycles is updated. The program processing has been performed, and hence the program information is still the value "1".

When 0b11111111 is written on a basis of a next write request 12, the number of bits of the erase processing and the number of bits of the program processing respectively become the value "0" and the value "4". The erase processing has not been performed, and hence the number of rewrite cycles does not change. Further, the program processing has been performed, and hence the program information is still the value "1".

As described above, in a case where, in the write request, the erase processing has been performed and the program information is the value "1", the number of rewrite cycles is updated. In the erase processing of the write requests 4 to 6 in the figure, the data having the bits written in the program processing in the write request 2 is merely erased in the different requests, and new program processing for these bits has not been performed. In view of this, in such a case, the number of rewrite cycles is updated in the write request 3, and updating of the number of rewrite cycles in the write requests in which only the following erase processing has been performed is excluded. In order to identify the write requests in which only the erase processing for the bits in which the values "1" are written by this program processing performed in the past is performed, the program information is used in the second embodiment of the present technology. As shown in the figure, in the write requests 4 to 6, the program information is the value "0", and hence the number of rewrite cycles is not updated. Further, the value "1" is set as the program information due to the program processing executed in the write request 6. With this, in the write request 8 involving the erase processing, the number of rewrite cycles is updated.

In contrast, as in the first embodiment of the present technology, in the method of adding up the number of erase cycles, the number of rewrite cycles is added up in the write requests 4 to 6, and an error is caused in the number of rewrite cycles unlike the second embodiment.

[Condition of Counting-of-Number-of-Rewrite-Cycle Determination]

FIG. 15 is a diagram showing a condition of the determination as to counting of the number of rewrite cycles in the second embodiment of the present technology. The figure shows a condition in a case where the number of rewrite cycles is updated, which is described in FIG. 14, as a truth-value table. As will be clear from the figure, in a case where the erase processing has been performed and the program information is the value "1", the number of rewrite cycles is updated. That is, in a case where the program processing has been performed in first executed writing of continuous writing in an identical page and the erase processing has been performed in next executed writing, the number of rewrite cycles is updated. Note that, in a case where both of the erase processing and the program processing have not been performed, the number of rewrite cycles is not updated and the program information is not changed. Such a case corresponds to a case where the data stored in the page before this writing is identical to the write data (e.g., cases of write requests 7 and 9 in FIG. 14).

[Processing Procedure of Number-of-Rewrite-Cycles Update Processing]

Figure 16:
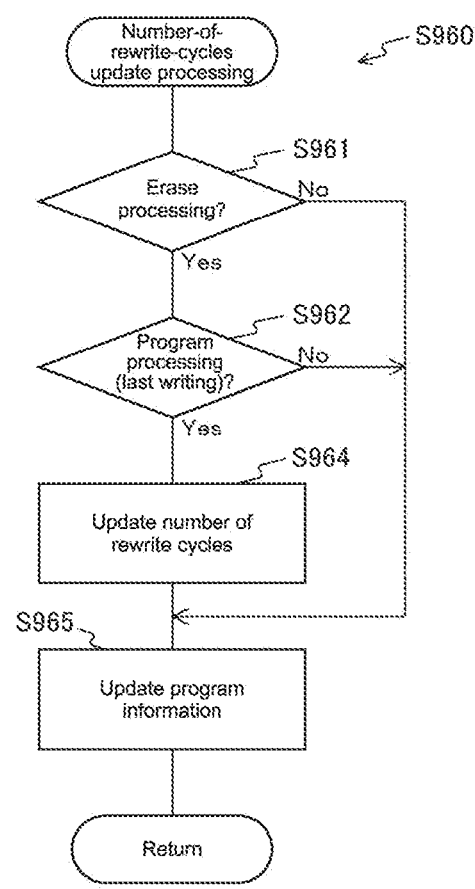
FIG. 16 A diagram showing an example of a processing procedure of number-of-rewrite-cycles update processing (Step S960) in the second embodiment of the present technology.

FIG. 16 is a diagram showing an example of a processing procedure of the number-of-rewrite-cycles update processing in the second embodiment of the present technology (Step S960). In the second embodiment of the present technology, this processing is executed instead of the number-of-rewrite-cycles update processing (Step S940) described in FIG. 10. First of all, the counting-of-number-of-rewrite-cycles determination unit 240 determines the presence/absence of the erase processing in the memory 300, on a basis of the received status (Step S961). As a result, if the erase processing has not been performed (Step S961: No), the counting-of-number-of-rewrite-cycles determination unit 240 shifts to processing of Step S965. If the erase processing has been performed (Step S961: Yes), the counting-of-number-of-rewrite-cycles determination unit 240 determines the presence/absence of the program processing in last writing (Step S962). This determination is performed on a basis of the program information retained in the program information retention unit 241.

As a result, if the program processing has been performed in the last writing (Step S962: Yes), the counting-of-number-of-rewrite-cycles determination unit 240 updates the number of rewrite cycles of the corresponding page which is retained in the number-of-rewrite-cycles management unit 230 (Step S964). With this, the value "1" is added to the number of rewrite cycles of the corresponding page. This is performed by outputting the determination information to the number-of-rewrite-cycles management unit 230. After that, the counting-of-number-of-rewrite-cycles determination unit 240 shifts to processing of Step S965. On the other hand, if the program processing has not been performed in the last writing (Step S962: No), the counting-of-number-of-rewrite-cycles determination unit 240 skips processing of Step S964 and shifts to processing of Step S965. In Step S965, the counting-of-number-of-rewrite-cycles determination unit 240 updates the program information retained in the program information retention unit 241, on a basis of the presence/absence of the program processing in the memory 300 (Step S965), and terminates this processing.

Processing in the memory controller 200 other than this is similar to the processing described in FIG. 9, and hence a description thereof will be omitted.

As described above, in accordance with the second embodiment of the present technology, it is possible to identify rewriting at different timings in a memory cell of an identical page and performs counting by updating the number of rewrite cycles on a basis of the erase information and the program information. With this, the accuracy of counting the number of rewrite cycles can be enhanced.

3. Third Embodiment

In the second embodiment, the number of rewrite cycles is counted for each page. In contrast, in a third embodiment of the present technology, the number of rewrite cycles is counted for each of regions obtained by dividing the page. With this, the accuracy of counting the number of rewrite cycles is enhanced.

[Configuration of Memory Controller]

Figure 17:
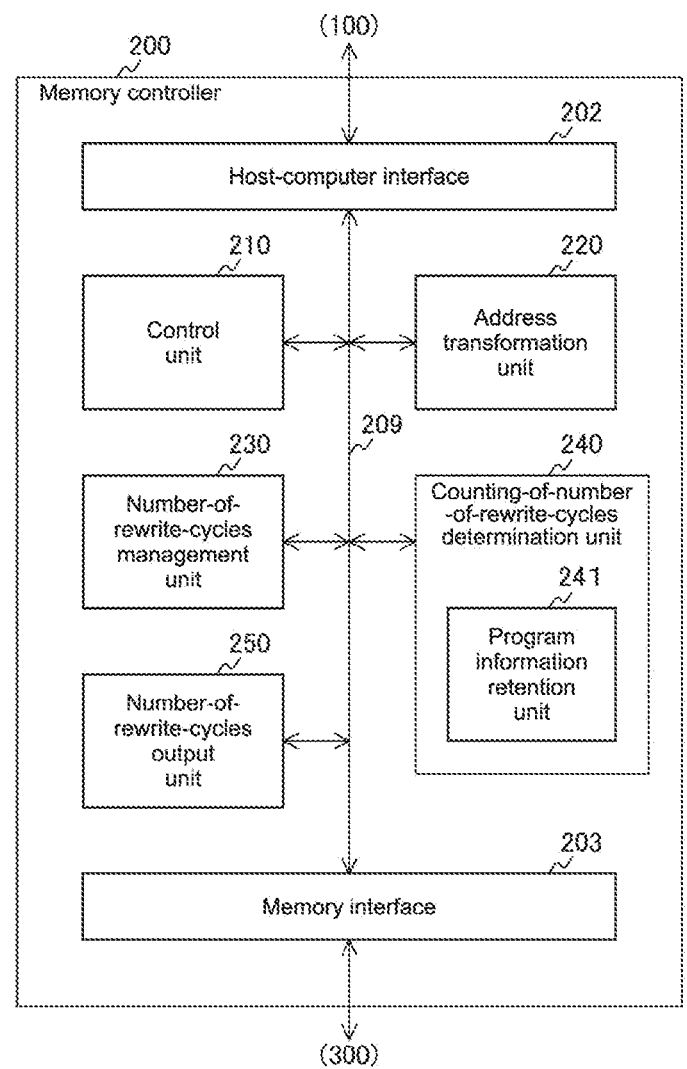
FIG. 17 A diagram showing a configuration example of a memory controller 200 in a third embodiment of the present technology.

FIG. 17 is a diagram showing a configuration example of a memory controller 200 in the third embodiment of the present technology. The memory controller 200 in the figure is different from the memory controller 200 described in FIG. 11 in that it further includes a number-of-rewrite-cycles output unit 250.

As will be described later, the memory 300 in the third embodiment of the present technology outputs the erase information and the program information as a status for each of regions obtained by dividing the page into predetermined sizes. The number-of-rewrite-cycles management unit 230 retains the number of rewrite cycles for each region. Similarly, the program information retention unit 241 also retains the program information for each region. The counting-of-number-of-rewrite-cycles determination unit 240 performs determination as to counting of the number of rewrite cycles for each region.

The number-of-rewrite-cycles output unit 250 outputs the number of rewrite cycles in the page. This number-of-rewrite-cycles output unit 250 outputs a maximum number of rewrite cycles among the numbers of rewrite cycles of the respective regions of the page, as the number of rewrite cycles in that page.

[Configuration of Memory]

The memory 300 in the third embodiment of the present technology performs writing and reading in units of pages and generates erase information and program information for each of regions obtained by dividing a page, and outputs them as a status. Specifically, the status generation unit 360 of the third embodiment of the present technology generates the erase information and the program information for each region in addition to a write result based on a result of the write request, as a status, and outputs them to the memory controller 200. In the third embodiment of the present technology, it is assumed that the page is divided into two regions (Region 1 and Region 2).

[Configuration of Status]

Figures 18, 19:
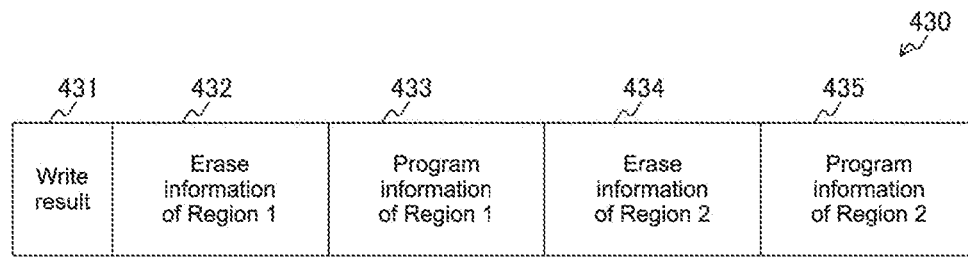
FIG. 18 A diagram showing a configuration example of a status in the third embodiment of the present technology.
FIG. 19 A diagram showing an example of the number of rewrite cycles in the third embodiment of the present technology.

FIG. 18 is a diagram showing a configuration example of the status in the third embodiment of the present technology. The figure shows a configuration of a status generated by the status generation unit 360 in the third embodiment of the present technology on a basis of a result of the write request. A status 430 in the figure includes a write result 431, erase information 432 of Region 1, program information 433 of Region 1, erase information 434 of Region 2, and program information 435 of Region 2.

[Number of Rewrite Cycles]

FIG. 19 is a diagram showing an example of the number of rewrite cycles in the third embodiment of the present technology. The number of rewrite cycles in the figure indicates the number of rewrite cycles retained in the number-of-rewrite-cycles management unit 230 in the third embodiment of the present technology. In this manner, the number of rewrite cycles is retained in the number-of-rewrite-cycles management unit 230 for each region.

[Program Information]

FIG. 20 is a diagram showing an example of the program information in the third embodiment of the present technology. The program information in the figure indicates the program information retained in the program information retention unit 241 in the third embodiment of the present technology. In this manner, the program information is retained in the program information retention unit 241 for each region.

Configurations of the memory controller 200 and the memory 300 other than this are similar to those of the memory controller 200 and the memory 300 described in FIGS. 2 and 3, and hence descriptions thereof will be omitted.

[Determination as to Counting of Number of Rewrite Cycles]

FIG. 21 is a diagram showing an example of the determination as to counting of the number of rewrite cycles in the third embodiment of the present technology. The figure shows, as in FIG. 14, a relationship between the number of bits of the erase processing, the number of bits of the program processing, the program information, and the number of rewrite cycles in a case where write requests for an identical page have been continuous. The section "a" in the figure shows a state of the determination as to counting of the number of rewrite cycles by the memory controller 200 and the memory 300 of the third embodiment of the present technology, and shows an example in a case where the determination as to counting of the number of rewrite cycles has been performed on Region 1 and Region 2. For the sake of convenience, it is assumed that the size of each region is 4 bits. The number of bits of the erase processing, the number of bits of the program processing, the program information, and the number of rewrite cycles are described, separating values and the like of the respective regions by the use of "/".

In the initial state, the data stored in the page is 0b01111010, and the program information is the value "1/1". When 0b00011010 is written on a basis of the write request 1 in this state, the erase processing is performed in Region 1 and the program information of Region 1 (before execution) is the value "1", and hence the number of rewrite cycles of Region 1 is updated. After that, writing of 0b00011110 and 0b00001111 is sequentially performed on a basis of the write requests 2 and 3. When 0b10000101 is written on a basis of the write request 4, the erase processing is performed in Region 2 and the program information of Region 2 (before execution) is the value "1", and hence the number of rewrite cycles of Region 2 is updated. In this manner, in the section "a" in the figure, updating of the number of rewrite cycles is performed on each of Region 1 and Region 2 one time. After that, a larger value of the number of rewrite cycles of Region 1 and Region 2 is output by the number-of-rewrite-cycles output unit 250 as the number of rewrite cycles in that page. This output number of rewrite cycles is employed as the number of rewrite cycles of that page when wear leveling to be described later or the like is performed.

On the other hand, the section "b" in the figure shows an example in a case where write requests similar to those of the section "a" in the figure have been given to the memory controller 200 and the memory 300 in the second embodiment of the present technology. As can be seen from the figure, the number of rewrite cycles is updated in the page three times. In the write request 3, the number of rewrite cycles has been updated on a basis of the erase processing of bits corresponding to Region 1 and the program processing of bits corresponding to Region 2 performed in the write request 2. In this manner, in the example of the section "b" in the figure, rewriting in the different memory cells from that page is unnecessarily updated. In contrast, in the section "a" in the figure, such updating of the number of rewrite cycles is excluded, and it is possible to highly accurately count the number of rewrite cycles.

[Processing Procedure of Number-of-Rewrite-Cycles Output Processing]

Figure 22:
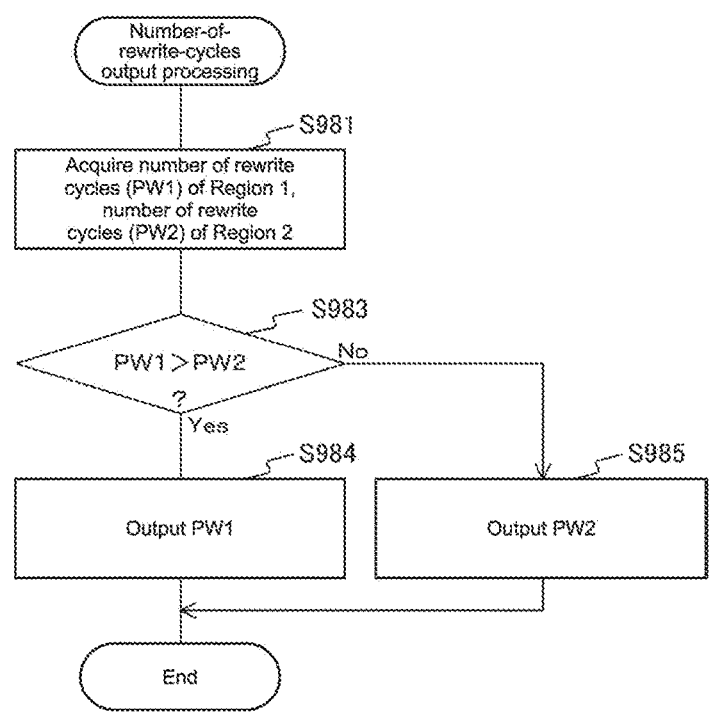
FIG. 22 A diagram showing an example of a processing procedure of number-of-rewrite-cycles output processing in the third embodiment of the present technology.

FIG. 22 is a diagram showing an example of a processing procedure of the number-of-rewrite-cycles output processing in the third embodiment of the present technology. The processing in the figure shows a processing procedure of the number-of-rewrite-cycles output processing in the number-of-rewrite-cycles output unit 250 described in FIG. 17, and this processing is performed when the number of rewrite cycles in the page is output. First of all, the number-of-rewrite-cycles output unit 250 acquires the number of rewrite cycles (PW1) of Region 1 and the number of rewrite cycles (PW2) of Region 2 which are managed in the number-of-rewrite-cycles management unit 230 (Step S981). Next, the number-of-rewrite-cycles output unit 250 compares PW1 with PW2 (Step S983). As a result, if W1 is larger (Step S983: Yes), the number-of-rewrite-cycles output unit 250 outputs PW1, that is, the number of rewrite cycles of Region 1 as the number of rewrite cycles in the page (Step S984).

On the other hand, if PW2 is larger or both are equal (Step S983: No), the number-of-rewrite-cycles output unit 250 outputs PW2, that is, the number of rewrite cycles of Region 2 as the number of rewrite cycles in the page (Step S985). After that, the number-of-rewrite-cycles output unit 250 terminates this processing.

As described above, in accordance with the third embodiment of the present technology, the number of rewrite cycles is counted for each region, and the larger one of the number of rewrite cycles thereof is output as the number of rewrite cycles in the page. Therefore, it is possible to more accurately count the number of rewrite cycles.

4. Fourth Embodiment

In the above-mentioned first embodiment, the system using the storage apparatus including the non-volatile memory has been assumed. In contrast, in a fourth embodiment of the present technology, a system in which this storage apparatus is provided with a replacement processing function is assumed. With this, it is possible to determine whether or not writing is possible on a basis of number-of-rewrite-cycle information of each page and perform replacement processing, and hence to enhance the reliability of the storage apparatus.

[Configuration of Memory Controller]

Figure 23:
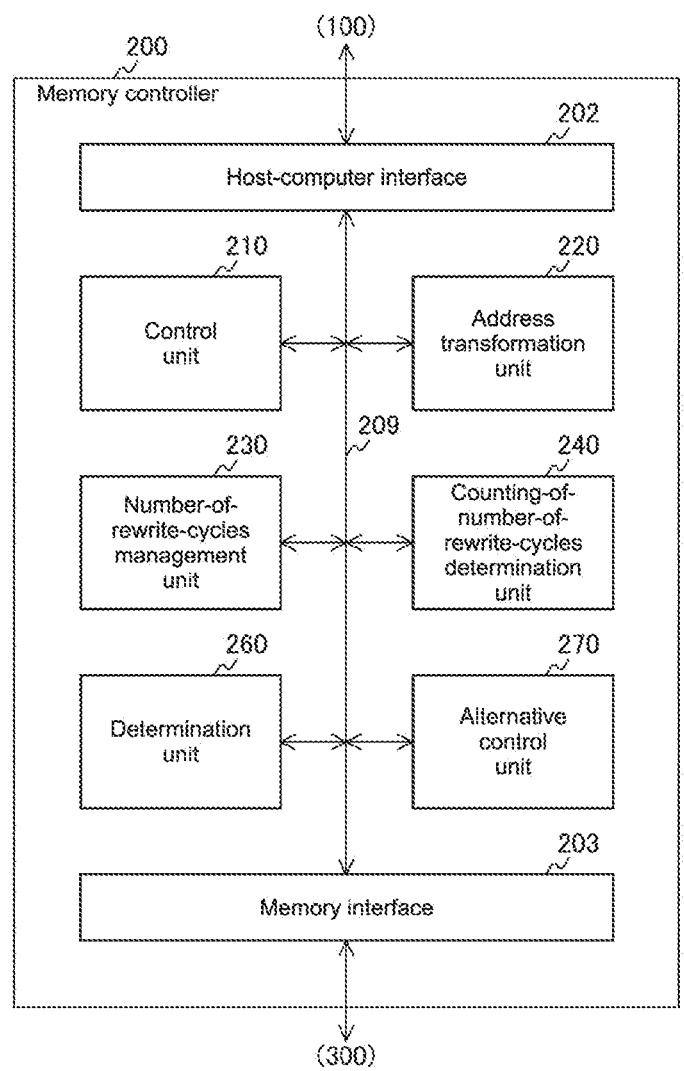
FIG. 23 A diagram showing a configuration example of a memory controller 200 in a fourth embodiment of the present technology.

FIG. 23 is a diagram showing a configuration example of a memory controller 200 in the fourth embodiment of the present technology. The memory controller 200 in the figure is different from the memory controller 200 described in FIG. 2 in that it further includes a determination unit 260 and a replacement control unit 270.

The determination unit 260 determines, on a basis of the number of rewrite cycles retained in the number-of-rewrite-cycles management unit 230, whether or not writing in the memory 300 is possible for each page. If the number of rewrite cycles of the page is smaller than a predetermined maximum number of rewrite cycles, this determination unit 260 determines that that page is rewritable. Here, the maximum number of rewrite cycles is a maximum number of cycles in which data is rewritable, which is set to the page. This maximum number of rewrite cycles is set on a basis of reliability and the like required of the system. Further, it is possible to also cope with replacement of a page in which a write error has occurred by performing processing of setting the number of rewrite cycles of the page in which the write error has occurred as the maximum number of rewrite cycles.

The replacement control unit 270 performs replacement on a basis of a result of the determination of the determination unit 260. Here, the replacement is processing of replacing a page on which writing is not possible by an unused page. This replacement control unit 270 performs replacement by changing the address transformation table retained in the address transformation unit 220.

When the memory controller 200 in the fourth embodiment of the present technology gives a write request to the memory 300, whether or not writing in a target page is possible is determined on a basis of the number of rewrite cycles. This determination is performed by the determination unit 260. If the writing is not possible, the replacement control unit 270 performs replacement. After that, the write request is given with respect to a page after replacement.

Configurations of the memory controller 200 and the memory 300 other than this are similar to those of the memory controller 200 and the memory 300 described in FIGS. 2 and 3, and hence descriptions thereof will be omitted.

[Determination Processing]

Figure 24:
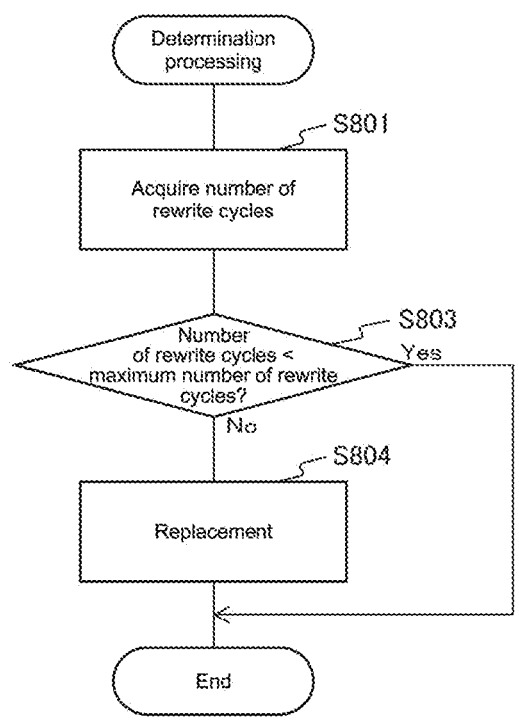
FIG. 24 A diagram showing an example of a processing procedure of determination processing in the fourth embodiment of the present technology.

FIG. 24 is a diagram showing an example of a processing procedure of the determination processing in the fourth embodiment of the present technology. The processing in the figure shows a processing procedure of the determination processing in the determination unit 260. First of all, the determination unit 260 acquires the number of rewrite cycles of a write-target page from the number-of-rewrite-cycles management unit 230 (Step S801). Next, the determination unit 260 compares the number of rewrite cycles with the maximum number of rewrite cycles (Step S803). As a result, if the number of rewrite cycles is smaller than the maximum number of rewrite cycles (Step S803: Yes), the determination unit 260 determines that the writing in that page is possible and terminates this processing. On the other hand, if the number of rewrite cycles is equal to or larger than the maximum number of rewrite cycles (Step S803: No), the determination unit 260 determines that the writing in that page is not possible. In this case, the replacement control unit 270 performs replacement (Step S804). After that, this processing is terminated.

In this manner, in the fourth embodiment of the present technology, whether or not writing is possible is determined on a basis of the number of rewrite cycles of each page, and replacement is performed if writing is not possible. With this, the reliability of the storage apparatus can be enhanced.

5. Fifth Embodiment

In the above-mentioned first embodiment, the system using the storage apparatus including the non-volatile memory has been assumed. In contrast, in a fifth embodiment of the present technology, a system in which this storage apparatus is provided with a wear leveling function is assumed. With this, it is possible to perform wear leveling on a basis of number-of-rewrite-cycle information of each page, and hence to enhance the reliability of the storage apparatus.

[Configuration of Memory Controller]

Figure 25:
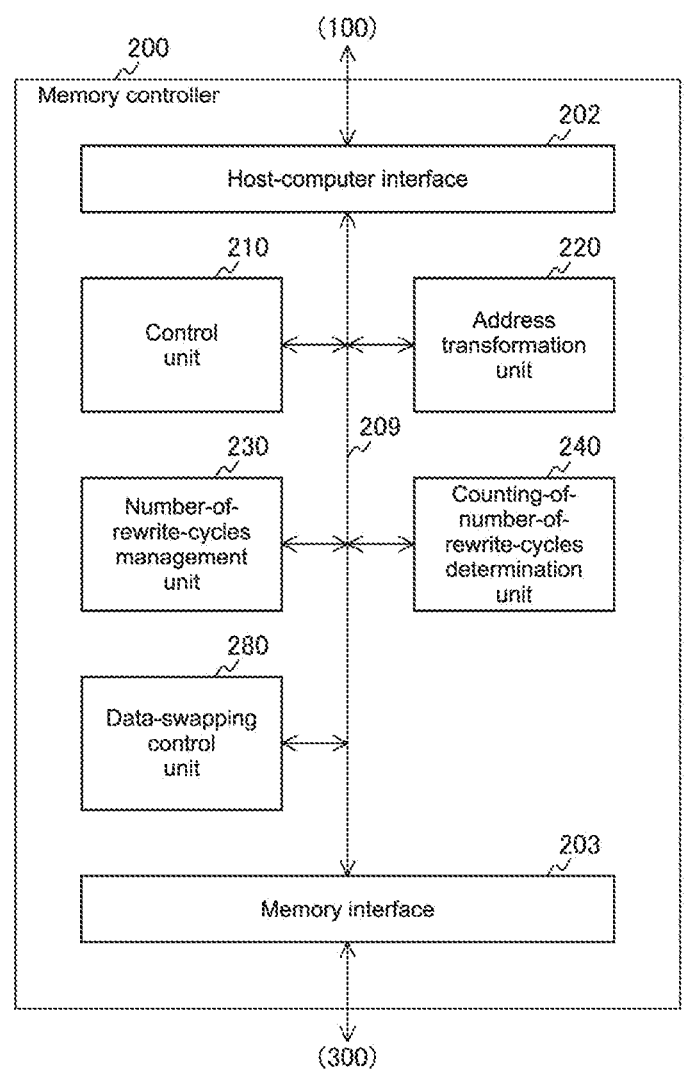
FIG. 25 A diagram showing a configuration example of a memory controller 200 in a fifth embodiment of the present technology.

FIG. 25 is a diagram showing a configuration example of the memory controller 200 in the fifth embodiment of the present technology. The memory controller 200 in the figure is different from the memory controller 200 described in FIG. 2 in that it further includes a data-swapping control unit 280.

The data-swapping control unit 280 performs wear leveling processing. Here, the wear leveling processing is processing of leveling the number of rewrite cycles of each page in the memory 300. If data having a higher rewrite frequency is stored in a particular page, that page has the number of rewrite cycles larger than that of other pages. In view of this, leveling of the number of rewrite cycles of each page is performed such that the data having the higher rewrite frequency is not stored in the particular page in a concentrated manner. Specifically, the data-swapping control unit 280 selects a page having a larger number of rewrite cycles of each page and a page having a smaller number of rewrite cycles of each page, and performs data swapping between these pages. Here, data swapping is writing data, which is read from one page, in the other page.

Configurations of the memory controller 200 and the memory 300 other this are similar to those of the memory controller 200 and the memory 300 described in FIGS. 2 and 3, and hence descriptions thereof will be omitted.

[Data Swapping Processing]

Figure 26:
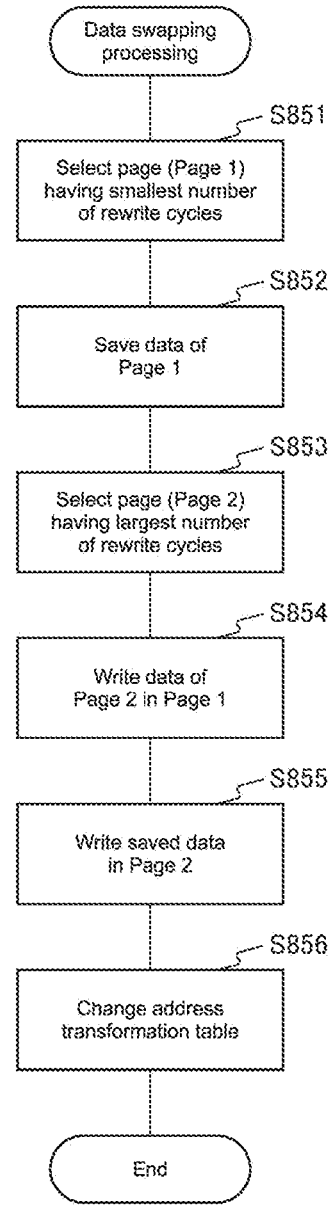
FIG. 26 A diagram showing an example of a processing procedure of data swapping processing in the fifth embodiment of the present technology.

FIG. 26 is a diagram showing an example of a processing procedure of the data swapping processing in the fifth embodiment of the present technology. The processing in the figure shows a processing procedure of the data swapping processing in the data-swapping control unit 280. First of all, the data-swapping control unit 280 selects a page (Page 1) having a smallest number of rewrite cycles on a basis of the number of rewrite cycles retained in the number-of-rewrite-cycles management unit 230 (Step S851). Next, the data-swapping control unit 280 saves data stored in Page 1 (Step S852). Specifically, the data-swapping control unit 280 temporarily saves the data stored in Page 1 in a vacant page.

Next, the data-swapping control unit 280 selects a page (Page 2) having a largest number of rewrite cycles on a basis of the number-of-rewrite-cycle information retained in the number-of-rewrite-cycles management unit 230 (Step S853). Next, the data-swapping control unit 280 writes data of Page 2 in Page (Step S854). Specifically, the data read from Page 2 is written in Page 1. Next, the data-swapping control unit 280 writes the data saved in Step S852 in Page 2 (Step S855). Lastly, the data-swapping control unit 280 updates the address transformation table retained in the address transformation unit 220 (Step S856), and terminates this processing.

As described above, in accordance with the fifth embodiment of the present technology, it is possible to perform wear leveling by performing data swapping on a basis of the number-of-rewrite-cycle information, and hence to enhance the reliability of the storage apparatus.

6. Sixth Embodiment

In the above-mentioned first embodiment, the memory controller 200 includes the counting-of-number-of-rewrite-cycles determination unit 240 and whether or not to count the number of rewrite cycles on a basis of the erase information output from the memory 300. In contrast, in a sixth embodiment of the present technology, the memory 300 includes the counting-of-number-of-rewrite-cycles determination unit and a result of the determination as to counting of the number of rewrite cycles, which is based on the erase information, inside the memory 300 is output to the memory controller 200. With this, the memory controller 200 only needs to retain a result of updating the number of rewrite cycles in the number-of-rewrite-cycles management unit 230, and the processing of counting the number of rewrite cycles can be simplified.

[Configuration of Memory Controller]

Figure 27:
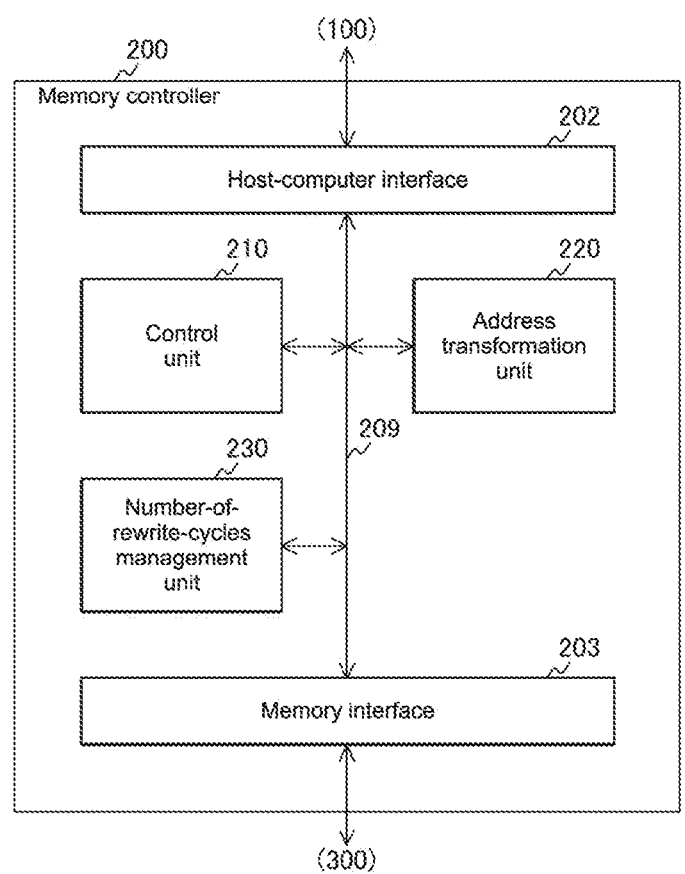
FIG. 27 A diagram showing a configuration example of a memory controller 200 in a sixth embodiment of the present technology.

FIG. 27 is a diagram showing a configuration example of a memory controller 200 in the sixth embodiment of the present technology. This memory controller 200 does not need to include the counting-of-number-of-rewrite-cycles determination unit 240 unlike the memory controller 200 described in FIG. 2.

The number-of-rewrite-cycles management unit 230 in the figure updates the number of rewrite cycles on a basis of the determination information included in the status output from the memory 300. This determination information will be described later.

[Configuration of Memory]

Figure 28:
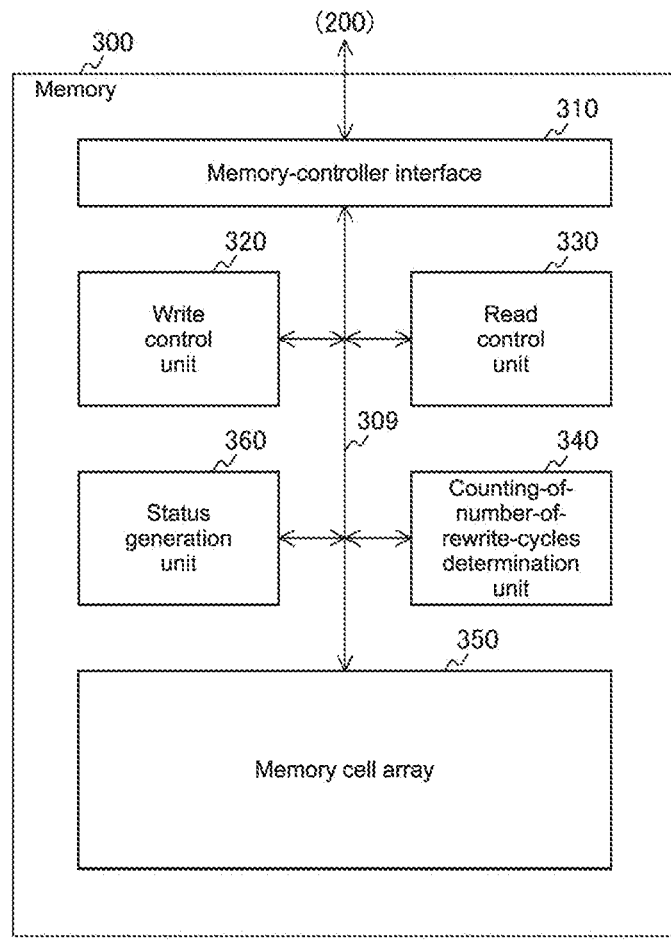
FIG. 28 A diagram showing a configuration example of a memory 300 in the sixth embodiment of the present technology.

FIG. 28 is a diagram showing a configuration example of a memory 300 in the sixth embodiment of the present technology. This memory 300 is different from the memory 300 described in FIG. 3 in that it further includes a counting-of-number-of-rewrite-cycles determination unit 340.

The status generation unit 360 in the figure outputs the erase information to the counting-of-number-of-rewrite-cycles determination unit 340, and outputs the write result and the determination information as the status to the memory controller 200. Here, the determination information is information for instructing the number-of-rewrite-cycles management unit 230 of the memory controller 200 to update the number of rewrite cycles.

The counting-of-number-of-rewrite-cycles determination unit 340 in the figure determines whether or not it is necessary to count the number of rewrite cycles in the target page on a basis of the erase information output by the status generation unit 360. The counting-of-number-of-rewrite-cycles determination unit 340 generates the determination information as a result of the determination, and outputs it to the status generation unit 360. As described above, this determination information is output to the memory controller 200 by the status generation unit 360. Note that the procedure of determining whether or not it is necessary to count the number of rewrite cycles in the counting-of-number-of-rewrite-cycles determination unit 340 is similar to the procedure of the determination described in the first embodiment of the present technology, and hence a description thereof will be omitted.

[Configuration of Status]

Figure 29:
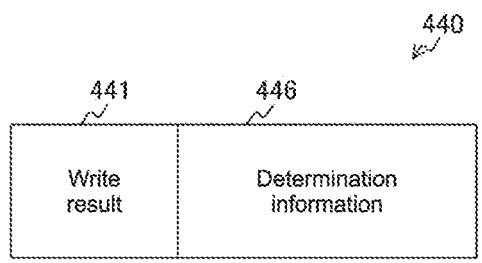
FIG. 29 A diagram showing a configuration example of a status in the sixth embodiment of the present technology.

FIG. 29 is a diagram showing a configuration example of the sixth embodiment of the present technology. A status 440 in the figure shows a configuration of a status generated by the status generation unit 360 of the memory 300 in the sixth embodiment. This status 440 includes a write result 441 and determination information 446. As this determination information 446, for example, the value "1" can be applied in a case where an updating instruction is made and the value "0" can be applied in a case where an updating instruction is not made. Further, a page address that is an update-target can also be added to the determination information, for example. Note that the write result 441 is similar to the write result 411 described in FIG. 6, and hence a description thereof will be omitted.

In this manner, in the sixth embodiment of the present technology, the determination as to whether or not to update the number of rewrite cycles is performed by the memory 300, and the number of rewrite cycles retained in the memory controller 200 on a basis of this result of determination is performed. Therefore, the memory controller 200 in the storage apparatus of the sixth embodiment of the present technology does not need to include the counting-of-number-of-rewrite-cycles determination unit.

Note that the counting-of-number-of-rewrite-cycles determination unit 340 in FIG. 28 can be configured to include the program information retention unit as in the counting-of-number-of-rewrite-cycles determination unit 240 described in FIG. 11. In that case, the status generation unit 360 outputs the program information in addition to the erase information to the counting-of-number-of-rewrite-cycles determination unit 340. After that, the counting-of-number-of-rewrite-cycles determination unit 340 causes the program information retention unit to retain the output program information for each page. Further, the counting-of-number-of-rewrite-cycles determination unit 340 determines whether or not it is necessary to update the number of rewrite cycles in a target page on a basis of this retained program information and the erase information output by the status generation unit 360. If it is determined that the updating is necessary, the counting-of-number-of-rewrite-cycles determination unit 340 generates determination information and outputs it to the status generation unit 360. As described above, this determination information is output to the memory controller 200 by the status generation unit 360. Note that the procedure of determining whether or not it is necessary to update the number of rewrite cycles in the counting-of-number-of-rewrite-cycles determination unit 340 is similar to the procedure of the determination described in the second embodiment of the present technology, and hence a description thereof will be omitted.

Further, the configuration in which the program information retention unit is included in the counting-of-number-of-rewrite-cycles determination unit 340 is employed, though not limited to this configuration. For example, a configuration in which the memory cell array 350 includes a program information region for retaining program information in addition to a data region for retaining data. In this case, the program information generated by the status generation unit 360 is written in this program information region together with the data. Further, the counting-of-number-of-rewrite-cycles determination unit 340 determines whether or not to update the number of rewrite cycles on a basis of the erase information and the program information retained in the program information region. Note that the program information region is an example of a program information retention unit described in the scope of claims.

Configurations of the memory controller 200 and the memory 300 other than this are similar to those of the memory controller 200 and the memory 300 described in FIGS. 2 and 3, and hence descriptions thereof will be omitted.

As described above, in accordance with the sixth embodiment of the present technology, the memory 300 performs determination as to counting of the number of rewrite cycles. Thus, it is possible to simplify the processing of counting the number of rewrite cycles in the memory controller 200.

As described above, in accordance with the embodiments of the present technology, the number of rewrite cycles is counted on a basis of the erase information output by the non-volatile memory that is overwritable. Thus, accuracy of the non-volatile memory to count the number of rewrite cycles can be enhanced.

Note that the above-mentioned embodiments provide examples for embodying the present technology and the matters in the embodiments and the invention-specifying matters in the scope of claims are associated. Similarly, the invention-specifying matters in the scope of claims and the matters in the embodiments of the present technology, which are denoted by the identical names, have correspondence. It should be noted that the present technology is not limited to the embodiments and can be embodied by making various modifications to the embodiments without departing from its essence.

Further, the processing procedures described in the above embodiments may be construed as methods including those series of procedures or a program for causing a computer to execute those series of procedures or may be construed as a recording medium storing that program. As this recording medium, a CD (Compact Disc), an MD (Mini Disc), a DVD (Digital Versatile Disc), a memory card, and a Blu-ray (registered trademark) disc can be used, for example.

Note that the effects described herein are merely examples and not limitative and other effects may be provided.

It should be noted that the present technology may also take the following configurations.

(1) A memory that outputs erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state.

(2) The memory according to (1) that further outputs program information that is information regarding whether or not the program processing has been performed in the writing.

(3) The memory according to (1) or (2) that outputs the erase information for each of regions obtained by dividing the page into predetermined sizes.

(4) A memory controller, including:
a counting-of-number-of-rewrite-cycles determination unit that determines, on a basis of erase information from a memory that outputs the erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state, whether or not to count the erase processing as the number of rewrite cycles of each of the pages; and
a number-of-rewrite-cycles management unit that updates and retains the number of rewrite cycles for each of the pages on a basis of a result of the determination.

(5) The memory controller according to (4), in which
the memory further outputs program information that is information regarding whether or not the program processing has been performed in the writing,
further including a program information retention unit that retains the output program information for each of the pages, in which
the counting-of-number-of-rewrite-cycles determination unit determines that the erase processing is to be counted as the number of rewrite cycles, the erase processing being based on the erase information output in a case where the program information retained when the writing is continuously performed on an identical page of the pages indicates execution of the program processing.

(6) The memory controller according to (4) or (5), in which
the memory outputs the erase information for each of regions obtained by dividing the page into predetermined sizes,
the counting-of-number-of-rewrite-cycles determination unit performs the determination for each of the regions, and
the number-of-rewrite-cycles management unit updates and retains the number of rewrite cycles for each of the regions,
further including a number-of-rewrite-cycles output unit that outputs a maximum number of rewrite cycles among the numbers of rewrite cycles of the respective regions in the retained page, as the number of rewrite cycles in the page.

(7) The memory controller according to any of (4) to (6), further including
a data-swapping control unit that controls data swapping of writing data read from one page of the pages in another page, the one page and the other page including a page having a larger number of rewrite cycles and a page having a smaller number of rewrite cycles, the larger number of rewrite cycles and the smaller number of rewrite cycles being included in the number of rewrite cycles retained in the number-of-rewrite-cycles management unit.

(8) A storage apparatus, including:
a memory that outputs erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state;
a counting-of-number-of-rewrite-cycles determination unit that determines, on a basis of the output erase information, whether or not to count the erase processing as the number of rewrite cycles of each of the pages; and
a number-of-rewrite-cycles management unit that updates and retains the number of rewrite cycles for each of the pages on a basis of a result of the determination.

(9) The storage apparatus according to (8), in which
the memory further outputs program information that is information regarding whether or not the program processing has been performed in the writing,
further including a program information retention unit that retains the output program information for each of the pages, in which
the counting-of-number-of-rewrite-cycles determination unit determines that the erase processing is to be counted as the number of rewrite cycles, the erase processing being based on the erase information output in a case where the program information retained when the writing is continuously performed on an identical page of the pages indicates execution of the program processing.

(10) An information processing system, including:
a storage apparatus including
a memory that outputs erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state,
a counting-of-number-of-rewrite-cycles determination unit that determines, on a basis of the output erase information, whether or not to count the erase processing as the number of rewrite cycles of each of the pages, and
a number-of-rewrite-cycles management unit that updates and retains the number of rewrite cycles for each of the pages on a basis of a result of the determination; and
a host computer that accesses the storage apparatus.

(11) A control method for a memory, including
an erase information output step of outputting erase information that is information regarding whether or not erase processing has been performed in writing of data in units of pages each including a plurality of memory cells in which data is rewritten by program processing of shifting a memory cell that stores data from an initial state to a data-storing state and erase processing of shifting the memory cell from the data-storing state to the initial state.

REFERENCE SIGNS LIST 100 host computer
200 memory controller
202 host-computer interface
203 memory interface
210 control unit
220 address transformation unit
230 number-of-rewrite-cycles management unit
240, 340 counting-of-number-of-rewrite-cycles determination unit
241 program information retention unit
250 number-of-rewrite-cycles output unit
260 determination unit
270 replacement control unit
280 data-swapping control unit
300 memory
310 memory-controller interface
320 write control unit 330 read control unit
350 memory cell array
351 storage element
352 MOS transistor
353 memory cell
360 status generation unit
410, 420, 430, 440 status
411, 421, 431, 441 write result
412, 422 erase information
423 program information
432 erase information of Region 1
433 program information of Region 1
434 erase information of Region 2
435 program information of Region 2
446 determination information

The invention claimed is:

1. A memory, comprising:
a control unit configured to write data in a unit of pages based on at least one of a program process or an erase process, wherein
each page of the pages includes a plurality of memory cells,
the program process indicates a shift of a state of a memory cell of the plurality of memory cells from an initial state to a data-storing state, and
the erase process indicates a shift of the state of the memory cell from the data-storing state to the initial state; and
a status generation unit configured to generate and output erase information that indicate whether the erase process is performed in the writing of the data.

2. The memory according to claim 1, wherein the status generation unit is further configured to generate and output program information that indicate whether the program process is performed in the writing of the data.

3. The memory according to claim 1, wherein
each page of the pages comprising a plurality of regions,
each region of the plurality of regions has a specific size, and
the status generation unit is further configured to generate and output the erase information for the plurality of regions of each page.

4. A memory controller, comprising:
a counting-of-number-of-rewrite-cycles determination unit configured to:
receive erase information from a memory, wherein
the erase information indicate whether an erase process is performed in writing of data,
the data is written in a unit of pages based on at least one of a program process or the erase process,
each page of the pages includes a plurality of memory cells,
the program process indicates a shift of a state of a memory cell of the plurality of memory cells from an initial state to a data-storing state, and
the erase process indicates a shift of the state of the memory cell from the data-storing state to the initial state; and
determine whether to count the erase process as a number of rewrite cycles for each page based on the received erase information; and
a number-of-rewrite-cycles management unit configured to update and retain the number of rewrite cycles for each page based on a result of the determination.

5. The memory controller according to claim 4, wherein the counting-of-number-of-rewrite-cycles determination unit is further configured to receive program information from the memory, wherein
the program information indicate whether the program process is performed in the writing of the data,
the memory controller further comprising a program information retention unit configure to retain the received program information for each of the pages,
the counting-of-number-of-rewrite-cycles determination unit is further configured to determine that the erase process is counted as the number of rewrite cycles, based on the erase information when the writing is continuously performed on a same page of the pages indicates execution of the program process.

6. The memory controller according to claim 4, wherein each page of the pages comprising a plurality of regions, each region of the plurality of regions has a specific size, the counting-of-number-of-rewrite-cycles determination unit is further configured to:
receive the erase information for the plurality of regions of each page, and
determine whether to count the erase process as the number of rewrite cycles for each region of each page based on the received erase information of the plurality of regions of each page,
the number-of-rewrite-cycles management unit is further configured to update and retain the number of rewrite cycles for each region of each page,
the memory controller further comprising a number-of-rewrite-cycles output unit configured to output a maximum number of rewrite cycles among the numbers of retained rewrite cycles of the respective regions of each page, as the number of rewrite cycles in the page.

7. The memory controller according to claim 4, further comprising a data-swapping control unit configured to control data swapping between a first page of the pages to a second page of the pages, wherein
the first page has a first number of rewrite cycles;
the second page has a second number of rewrite cycles,
the first number is larger than the second number, and
the first number of rewrite cycles and the second number of rewrite cycles are included in the number of rewrite cycles retained in the number-of-rewrite-cycles management unit.

8. A storage apparatus, comprising:
a memory that comprises:
a control unit configured to write data in a unit of pages based on at least one of a program process or an erase process, wherein
each page of the pages includes a plurality of memory cells,
the program process indicates a shift of a state of a memory cell of the plurality of memory cells from an initial state to a data-storing state, and
the erase process indicates a shift of the state of the memory cell from the data-storing state to the initial state; and
a status generation unit configured to generate and output erase information that indicate whether the erase process is performed in the writing of the data;
a counting-of-number-of-rewrite-cycles determination unit configured to:
receive the erase information from the memory; and
determine whether to count the erase process as a number of rewrite cycles for each page based on the received erase information; and a number-of-rewrite-cycles management unit configured to update and retain the number of rewrite cycles for each page based on a result of the determination.

9. The storage apparatus according to claim 8, wherein
the counting-of-number-of-rewrite-cycles determination unit is further configured to receive program information from the memory, wherein
the program information indicate whether the program process is performed in the writing of the data,
the storage apparatus further comprising a program information retention unit configured to retain the received program information for each of the pages,
the counting-of-number-of-rewrite-cycles determination unit is further configured to determine that the erase process is counted as the number of rewrite cycles, based on the erase information when the writing is continuously performed on a same page of the pages indicates execution of the program process.

10. An information processing system, comprising:
a storage apparatus that includes:
a memory that comprises:
a control unit configured to write data in a unit of pages based on at least one of a program process or an erase process, wherein
each page of the pages includes a plurality of memory cells,
the program process indicates a shift of a state of a memory cell of the plurality of memory cells from an initial state to a data-storing state, and
the erase process indicates a shift of the state of the memory cell from the data-storing state to the initial state; and
a status generation unit configured to generate and output erase information that indicate whether the erase process is performed in the writing of the data;
a counting-of-number-of-rewrite-cycles determination unit configured to:
receive the erase information from the memory; and
determine whether to count the erase process as a number of rewrite cycles for each page based on the received erase information; and
a number-of-rewrite-cycles management unit configured to update and retain the number of rewrite cycles for each page based on a result of the determination; and
a host computer configured to access the storage apparatus.

11. A control method for a memory, comprising:
writing data in a unit of pages based on at least one of a program process or an erase process, wherein
each page of the pages includes a plurality of memory cells,
the program process indicates a shift of a state of a memory cell of the plurality of memory cells from an initial state to a data-storing state, and
the erase process indicates a shift of the state of the memory cell from the data-storing state to the initial state; and
generating and outputting erase information that indicate whether the erase process is performed in the writing of the data.

* * * * *